US011101289B1

(12) United States Patent
Ueda et al.

(10) Patent No.: US 11,101,289 B1
(45) Date of Patent: Aug. 24, 2021

(54) THREE-DIMENSIONAL MEMORY DEVICE WITH COMPOSITE CHARGE STORAGE STRUCTURES AND METHODS FOR FORMING THE SAME

(71) Applicant: SANDISK TECHNOLOGIES LLC, Addison, TX (US)

(72) Inventors: Yu Ueda, Yokkaichi (JP); Michiaki Sano, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/794,536

(22) Filed: Feb. 19, 2020

(51) Int. Cl.
*H01L 27/11582* (2017.01)
*H01L 27/11565* (2017.01)

(52) U.S. Cl.
CPC .. *H01L 27/11582* (2013.01); *H01L 27/11565* (2013.01)

(58) Field of Classification Search
CPC ......... H01L 27/11582; H01L 27/11565; H01L 27/11578
See application file for complete search history.

(56) References Cited

U.S. PATENT DOCUMENTS

| | | | |
|---|---|---|---|
| 5,915,167 A | 6/1999 | Leedy | |
| 8,349,681 B2 | 1/2013 | Alsmeier et al. | |
| 9,136,130 B1 | 9/2015 | Wada et al. | |
| 9,397,093 B2 | 7/2016 | Makala et al. | |
| 9,552,991 B2 | 1/2017 | Matsudaira et al. | |
| 9,613,977 B2 | 4/2017 | Sharangpani et al. | |
| 9,711,530 B1 | 7/2017 | Ikawa et al. | |
| 9,875,929 B1 | 1/2018 | Shukla et al. | |
| 9,922,987 B1 | 3/2018 | Mizutani et al. | |
| 9,960,180 B1 | 5/2018 | Zhou et al. | |
| 9,991,277 B1 | 6/2018 | Tsutsumi et al. | |
| 10,651,195 B2 * | 5/2020 | Lee | H01L 27/11524 |

(Continued)

OTHER PUBLICATIONS

Endoh et al., "Novel Ultra High Density Memory With a Stacked-Surrounding Gate Transistor (S-SGT) Structured Cell", IEDM Proc. (2001) 33-36.

(Continued)

*Primary Examiner* — Allison Bernstein
(74) *Attorney, Agent, or Firm* — The Marbury Law Group PLLC

(57) ABSTRACT

A memory device includes an alternating stack of insulating layers and electrically conductive layers located over a substrate, and a memory stack structure extending through the alternating stack. The memory stack structure includes a composite charge storage structure, a tunneling dielectric layer, and a vertical semiconductor channel. The composite charge storage structure may include a vertical stack of tubular charge storage material portions including a first charge trapping material located at levels of the electrically conductive layers, and a charge storage layer including a second charge trapping material extending through a plurality of electrically conductive layers of the electrically conductive layers. The first charge trapping material has a higher charge trap density than the second charge trapping material. Alternatively, the composite charge storage material portions may include discrete charge storage elements each containing a silicon nitride portion and a silicon carbide nitride liner.

17 Claims, 39 Drawing Sheets

(56) References Cited

U.S. PATENT DOCUMENTS

| | | |
|---|---|---|
| 2009/0085218 A1 | 4/2009 | Shim |
| 2009/0091040 A1 | 4/2009 | Uchida et al. |
| 2009/0140428 A1 | 6/2009 | Bonilla et al. |
| 2014/0042516 A1 | 2/2014 | Kim et al. |
| 2015/0318333 A1 | 11/2015 | Narayanan et al. |
| 2016/0111291 A1 | 4/2016 | Kim et al. |
| 2016/0204059 A1 | 7/2016 | Fukuo et al. |
| 2017/0243950 A1 | 8/2017 | Liu et al. |
| 2017/0352681 A1 | 12/2017 | Lee |
| 2017/0365522 A1 | 12/2017 | Jeong et al. |
| 2017/0373079 A1 | 12/2017 | Sharangpani et al. |
| 2018/0018263 A1 | 1/2018 | Cho et al. |
| 2018/0108664 A1 | 4/2018 | Lee et al. |
| 2018/0204881 A1 | 7/2018 | Sei et al. |
| 2018/0226567 A1 | 8/2018 | Lee et al. |
| 2019/0198520 A1 | 6/2019 | Kim et al. |
| 2019/0252045 A1 | 8/2019 | Tsutsumi |
| 2019/0319043 A1 | 10/2019 | Takashima et al. |
| 2019/0371807 A1 | 12/2019 | Nishikawa et al. |
| 2020/0006374 A1 | 1/2020 | Zhou et al. |
| 2020/0312874 A1 | 10/2020 | Kang et al. |

OTHER PUBLICATIONS

Otake et al., "Theoretical studies on the charge trap mechanism of MONOS type memories—Relationship between atomistic information and program/erase actions", Microelectronic Engineering 86 (2009) 1849-1851.

Yamaguchi et al., "Atomistic Guiding Principles for MONOS-Type Memories with High Program/Erase Cycle Endurance", IEDM09-278 (2009).

E. Vianello et al., "Impact of the charge transport in the conduction band on the retention of Si-Nitride based memories" IEEE ESSDERC, 2008 pp. 107-110.

C.W. Chen et al., "Structural and electronic properties of wide band gap silicon carbon nitride materials—a first-principles study", Diamond and Related Materials, 13 (2004) pp. 1158-1165.

U.S. Appl. No. 16/582,262, filed Sep. 25, 2019, SanDisk Technologies LLC.

U.S. Appl. No. 16/728,327, filed Dec. 27, 2019, SanDisk Technologies LLC.

Notification of Transmittal of the International Search Report and Written Opinion of the International Search Authority for International Patent Application No. PCT/US2020/035566, dated Oct. 4, 2020, 9 pages.

S. King et al., "Valence and conduction band offsets at low-k a-SiOxCy:H/a-SiCxNy:H interfaces", J. Appl. Phys. 116, 113703 (2014); https://doi.org/10.1063/1.4895135, 7 pages.

U.S. Appl. No. 16/794,563, filed Feb. 20, 2020.

USPTO Office Communication, Non-Final Office Communication for U.S. Appl. No. 16/794,563, dated Feb. 3, 2021, 28 pages.

* cited by examiner

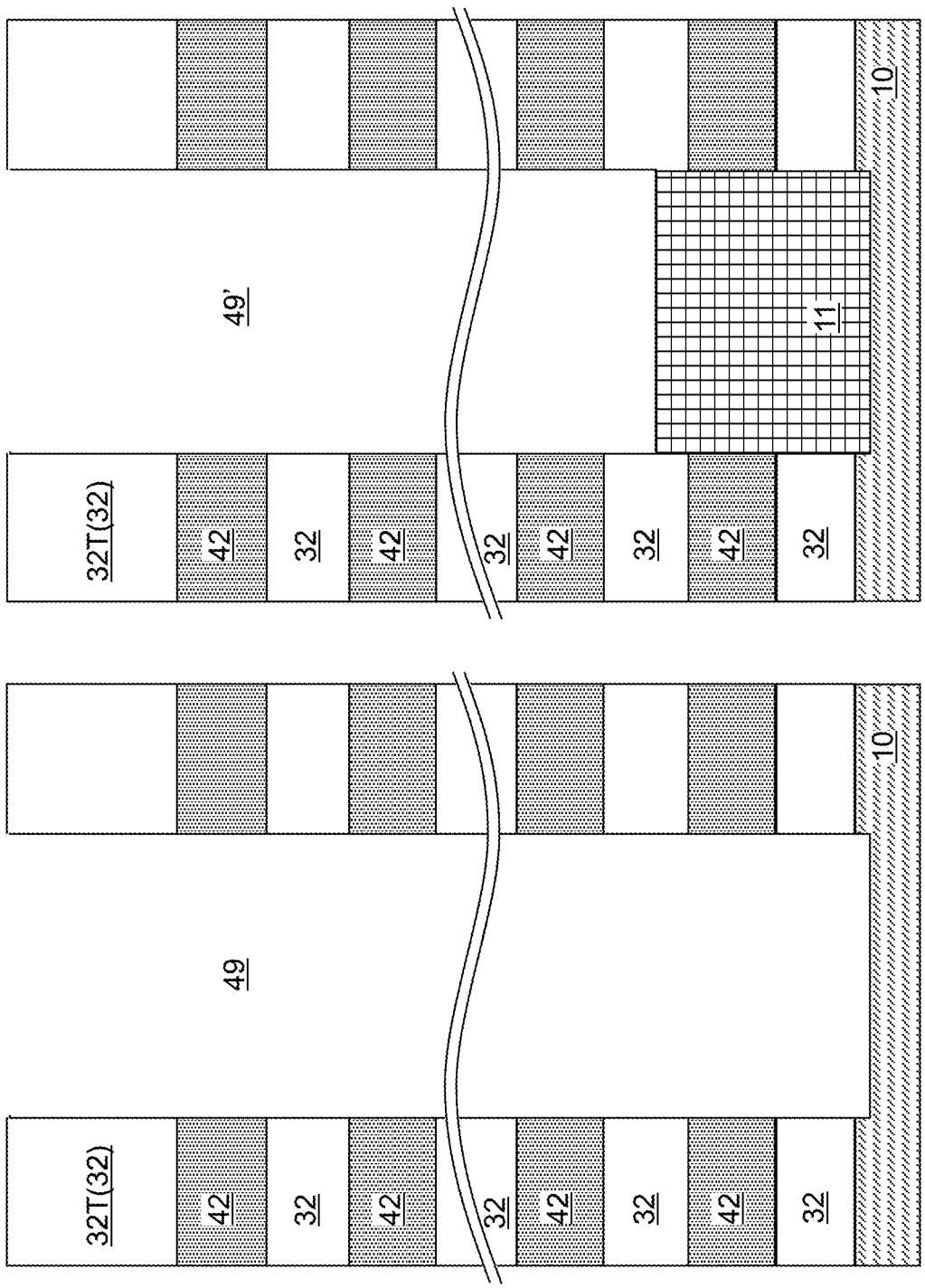

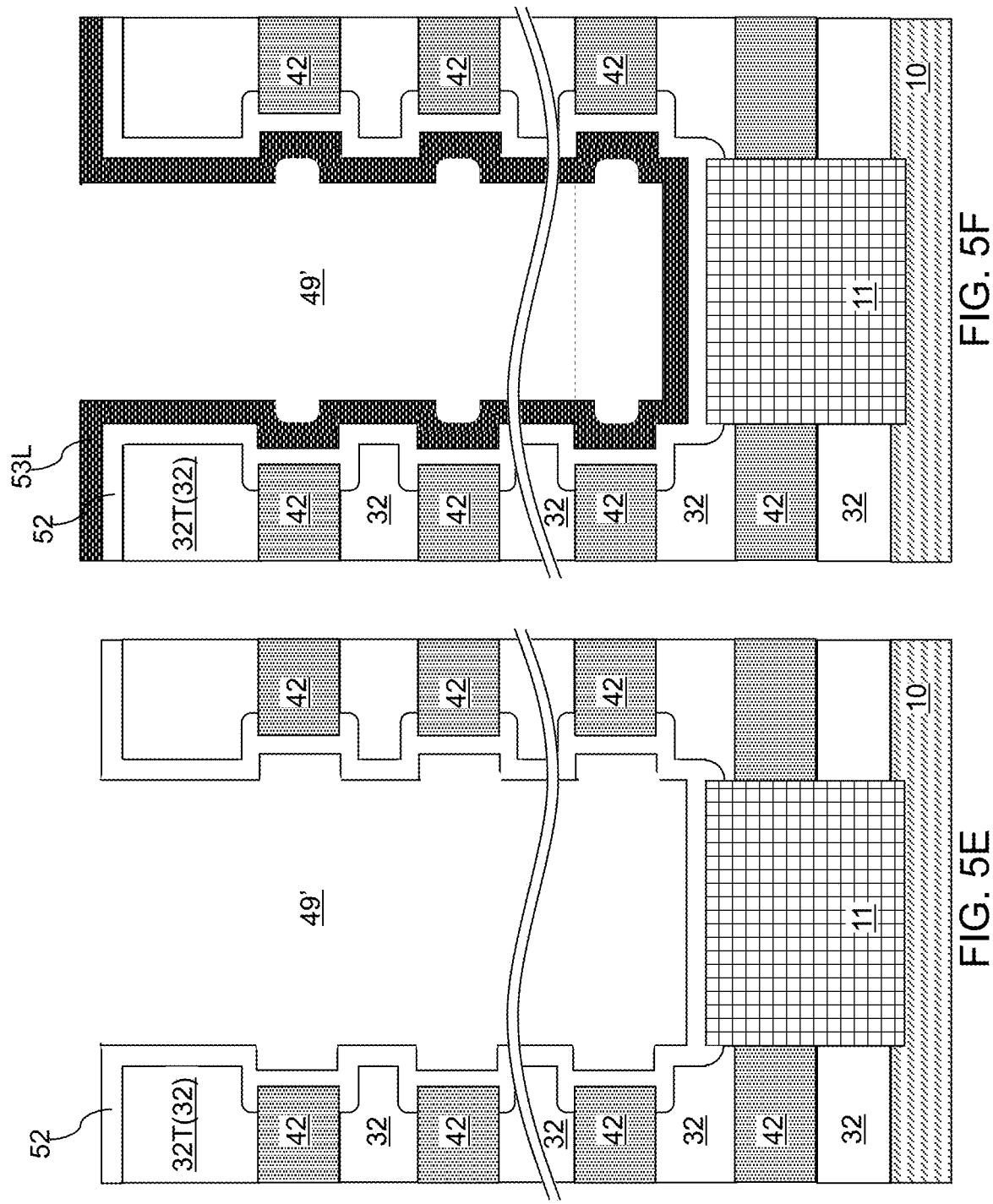

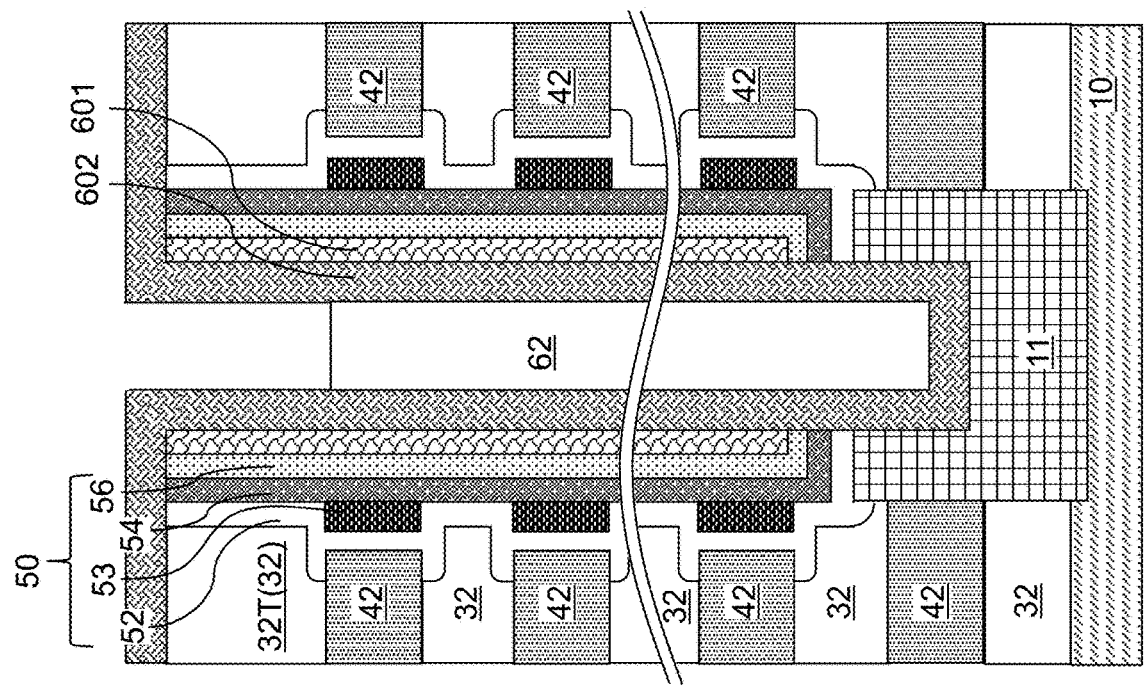
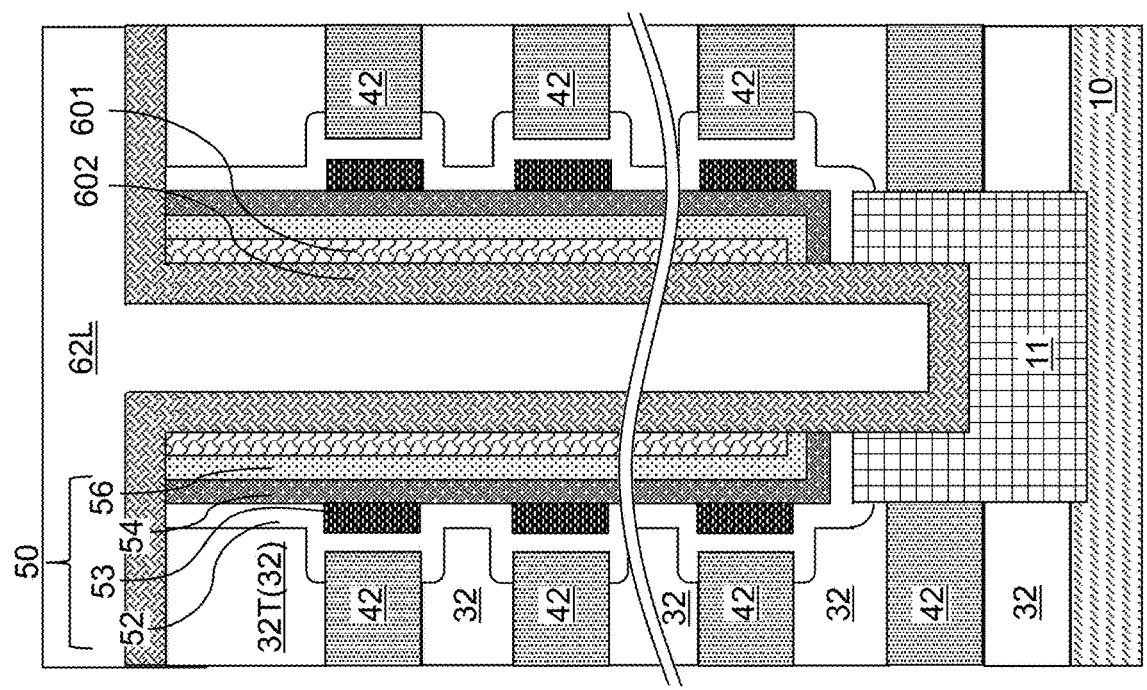

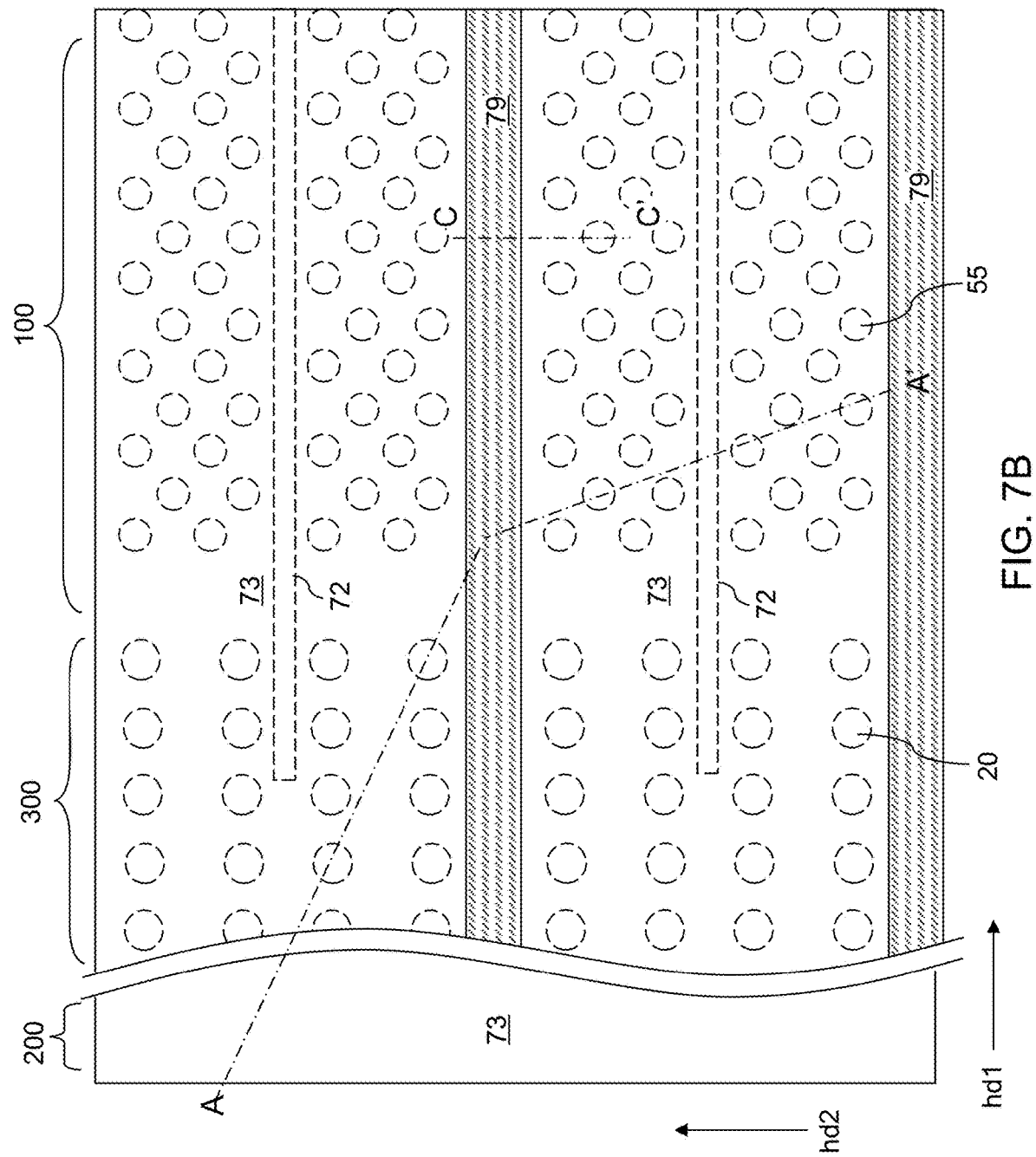

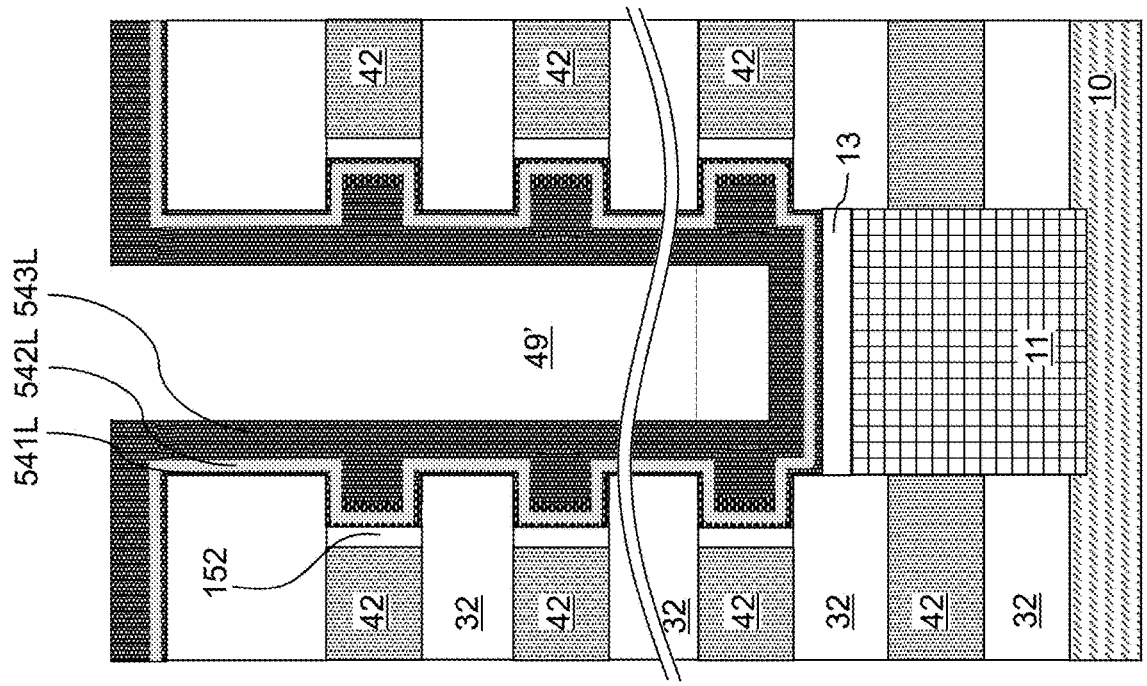
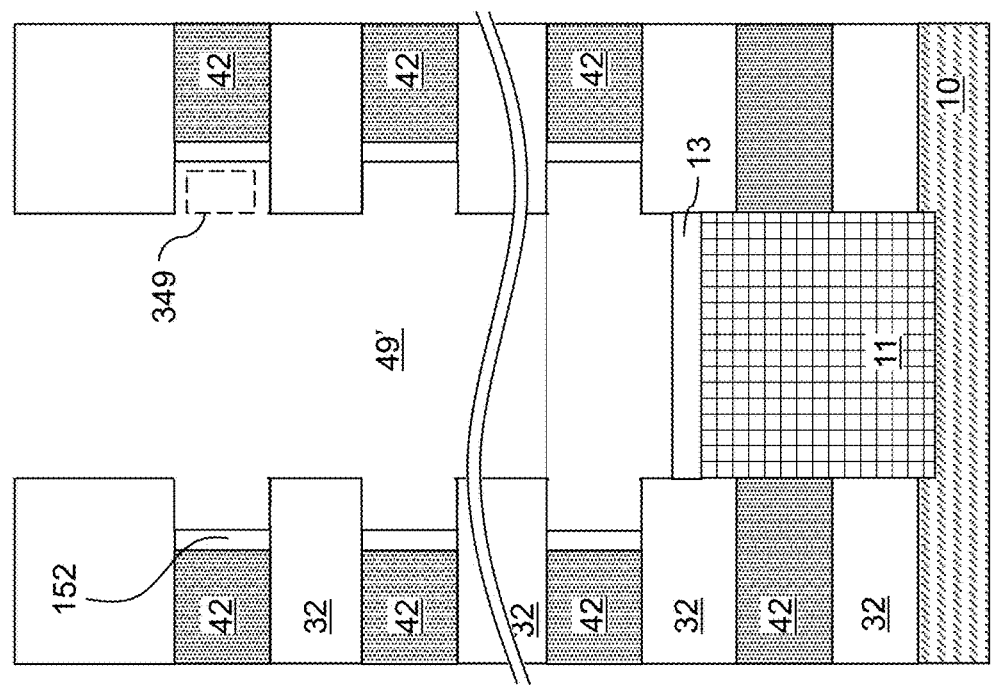

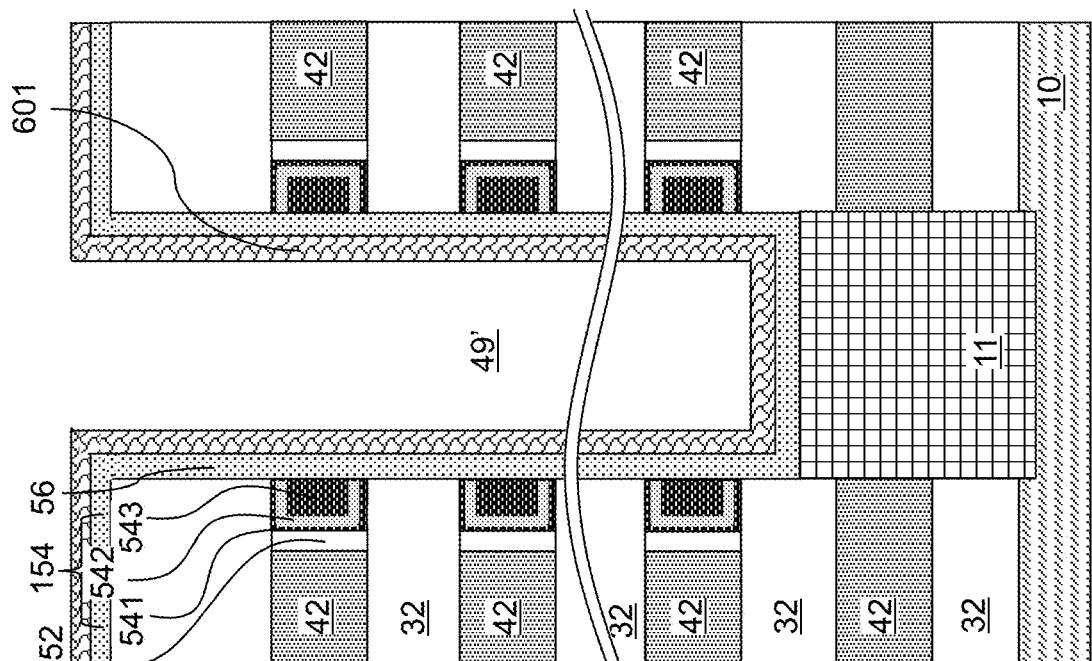
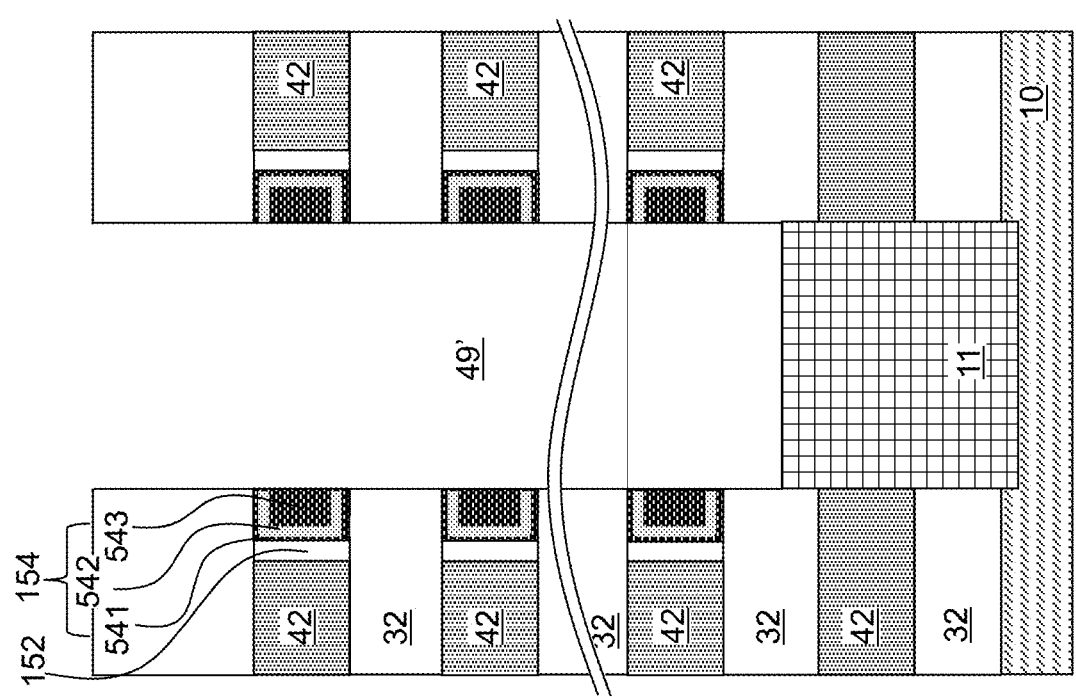

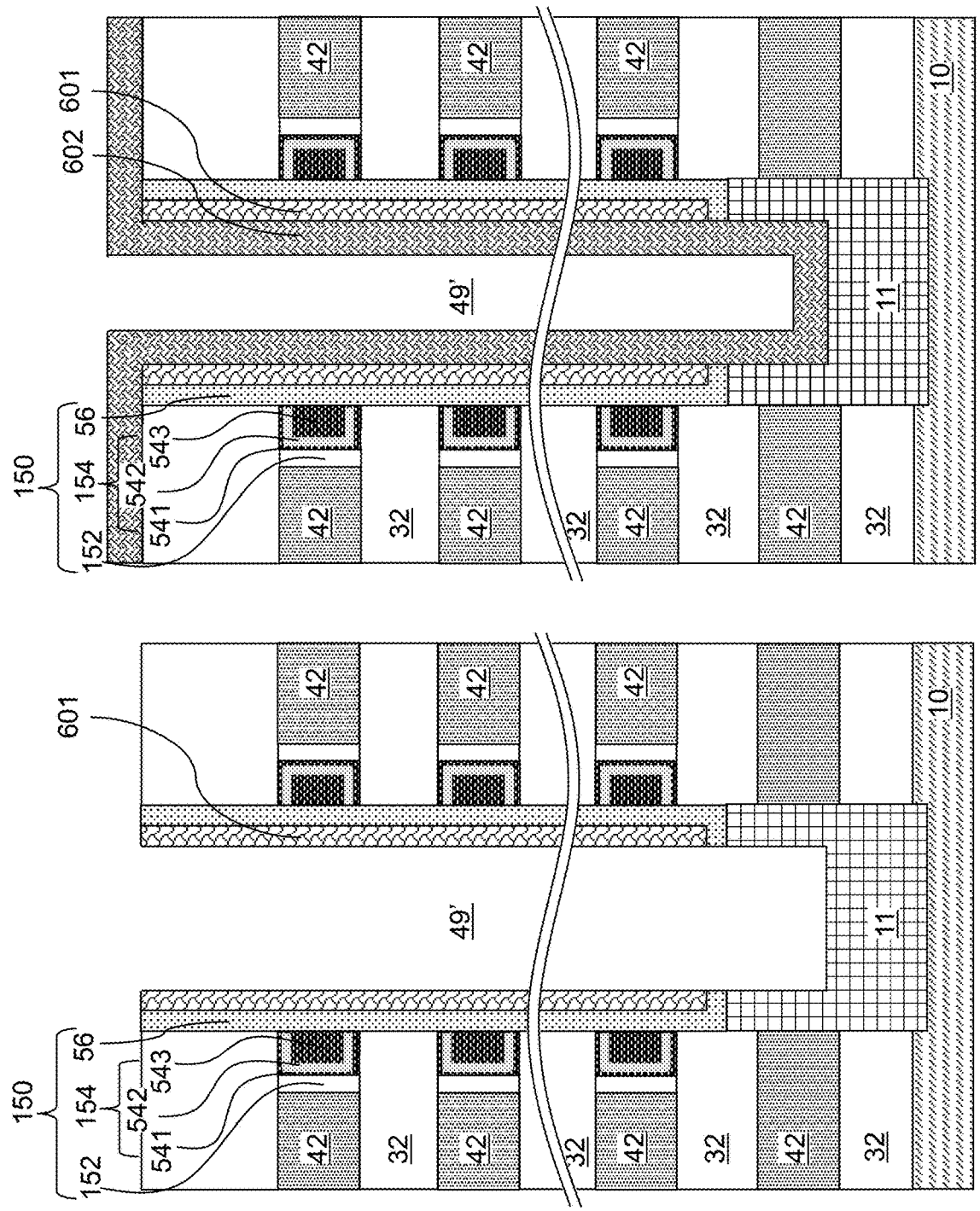

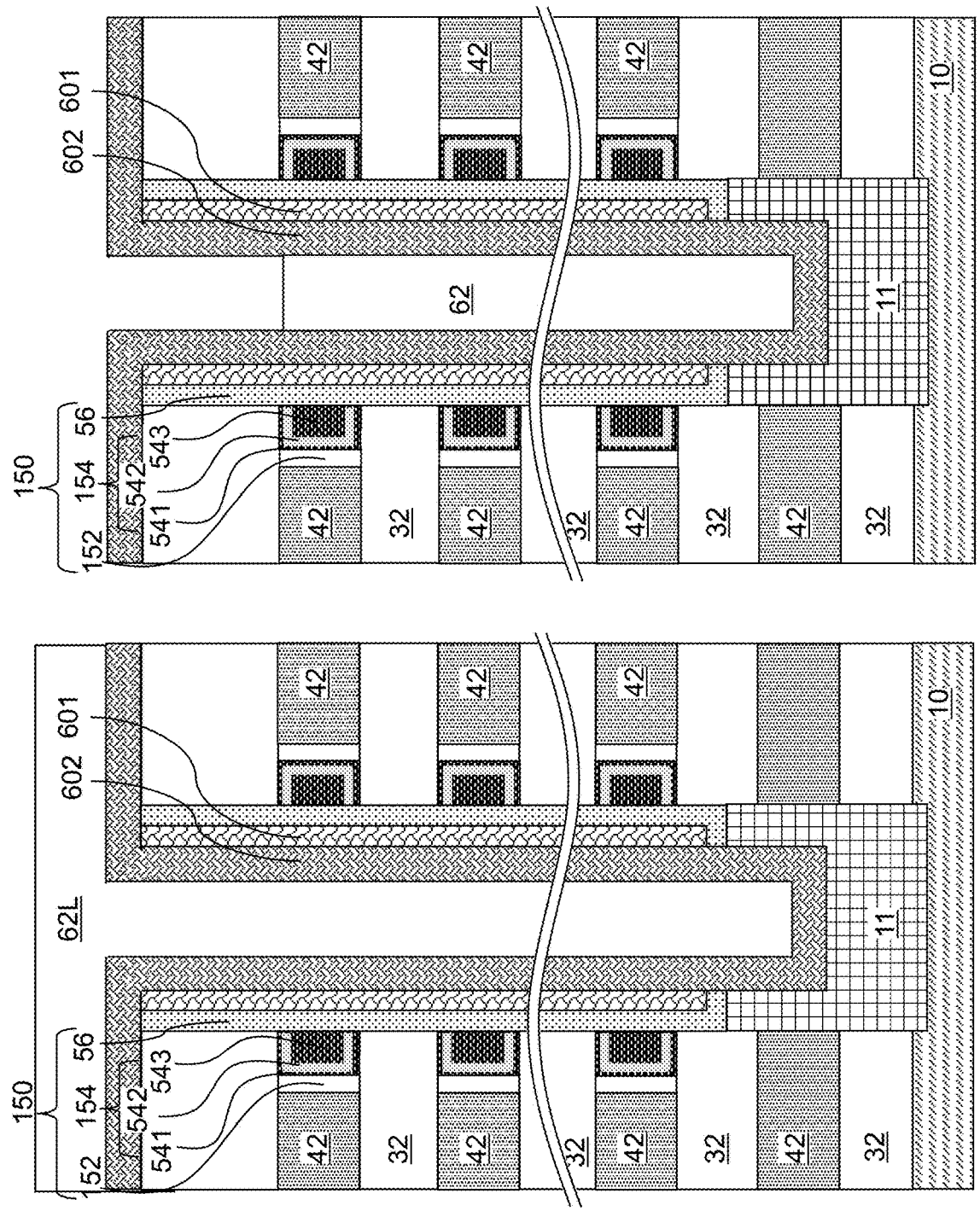

THREE-DIMENSIONAL MEMORY DEVICE WITH COMPOSITE CHARGE STORAGE STRUCTURES AND METHODS FOR FORMING THE SAME

FIELD

The present disclosure relates generally to the field of semiconductor devices, and particularly to a three-dimensional memory device with composite charge storage structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: an alternating stack of insulating layers and electrically conductive layers located over a substrate; and a memory stack structure extending through the alternating stack, wherein the memory stack structure comprises a composite charge storage structure, a tunneling dielectric layer located on an inner sidewall of the composite charge storage structure, and a vertical semiconductor channel contacting an inner sidewall of the tunneling dielectric layer. The composite charge storage structure comprises a vertical stack of discrete tubular charge storage material portions including a first charge trapping material located at levels of the electrically conductive layers and vertically spaced apart from each other, and a continuous charge storage layer including a second charge trapping material extending through a plurality of the electrically conductive layers. The first charge trapping material has a higher charge trap density than the second charge trapping material.

According to another aspect of the present disclosure, a method of forming a memory device is provided, which comprises: forming an alternating stack of insulating layers and spacer material layers over a substrate, wherein the spacer material layers are formed as, or are subsequently replaced with, electrically conductive layers; forming a memory opening through the alternating stack; and forming a memory stack structure by sequentially forming a composite charge storage structure, a tunneling dielectric layer, and a vertical semiconductor channel in the memory opening. The composite charge storage structure is formed by: forming a vertical stack of tubular charge storage material portions including a first charge trapping material and at levels of the electrically conductive layers as discrete material portions that are vertically spaced apart by the insulating layers; and forming a charge storage layer including a second charge trapping material and extending through a plurality of electrically conductive layers of the electrically conductive layers.

According to an aspect of the present disclosure, a memory device is provided, which comprises: an alternating stack of insulating layers and electrically conductive layers located over a substrate; and a memory stack structure extending through the alternating stack, wherein the memory stack structure comprises a vertical stack of discrete charge storage elements that are vertically spaced apart from each other and located at levels of the electrically conductive layers, a tunneling dielectric layer located on inner sidewalls of the discrete charge storage elements, and a vertical semiconductor channel contacting an inner sidewall of the tunneling dielectric layer, wherein each of the discrete charge storage elements comprises: a silicon nitride portion including an inner sidewall that contacts an outer sidewall of the tunneling dielectric layer; and a silicon carbide nitride liner in contact with the silicon nitride portion.

According to another aspect of the present disclosure, a method of forming a memory device is provided, which comprises: forming an alternating stack of insulating layers and sacrificial material layers over a substrate; forming a memory opening through the alternating stack; forming annular recess regions around the memory opening at levels of the sacrificial material layers; forming discrete charge storage elements in the annular recess regions, wherein each of the discrete charge storage elements comprises a silicon nitride portion and a silicon carbide nitride liner disposed between the silicon nitride portion and a respective one of the sacrificial material layers located at a same level as the silicon nitride portion; forming a tunneling dielectric layer, a vertical semiconductor channel, and a drain region in the memory opening; and replacing the sacrificial material layers with electrically conductive layers.

BRIEF DESCRIPTION OF THE DRAWINGS

FIGS. 5A-5M are sequential schematic vertical cross-sectional views of a memory opening within the first exemplary structure during formation of a memory stack structure, an optional dielectric core, and a drain region therein according to the first embodiment of the present disclosure.

FIG. 7B is a partial see-through top-down view of the first exemplary structure of FIG. 7A. The vertical plane A-A' is the plane of the schematic vertical cross-sectional view of FIG. 7A.

FIGS. 14A-14K are sequential schematic vertical cross-sectional views of a memory opening within a second exemplary structure during formation of a memory stack structure, an optional dielectric core, and a drain region therein according to a second embodiment of the present disclosure.

DETAILED DESCRIPTION

Figure 1:
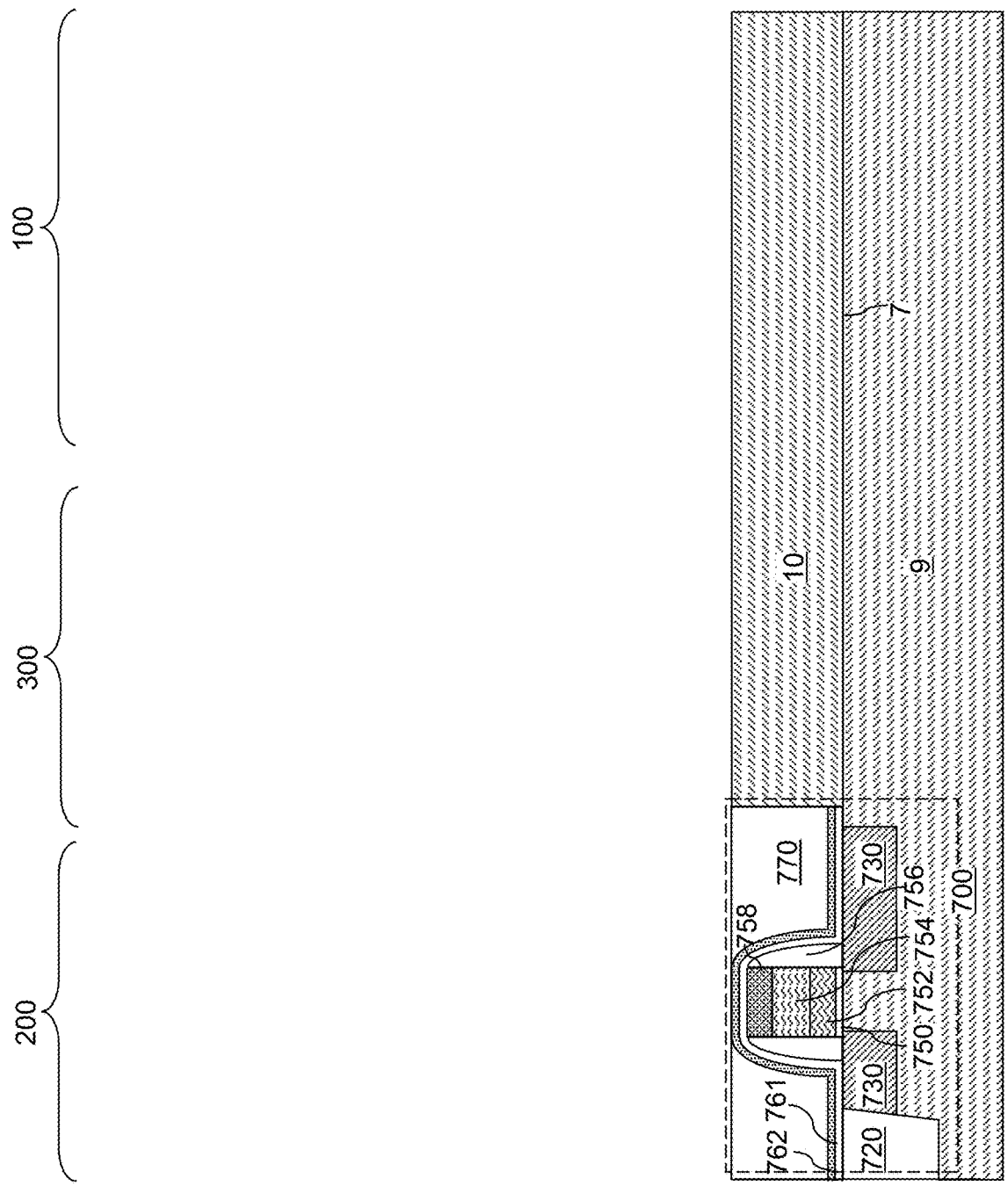
FIG. 1 is a schematic vertical cross-sectional view of a first exemplary structure after formation of at least one peripheral device and a semiconductor material layer according to a first embodiment of the present disclosure.

As discussed above, the embodiments of the present disclosure are directed to a three-dimensional memory device with composite charge storage structures and methods of manufacturing the same, the various aspects of which are described below. The embodiments of the disclosure can be employed to form various structures including a multi-level memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

Figure 2:
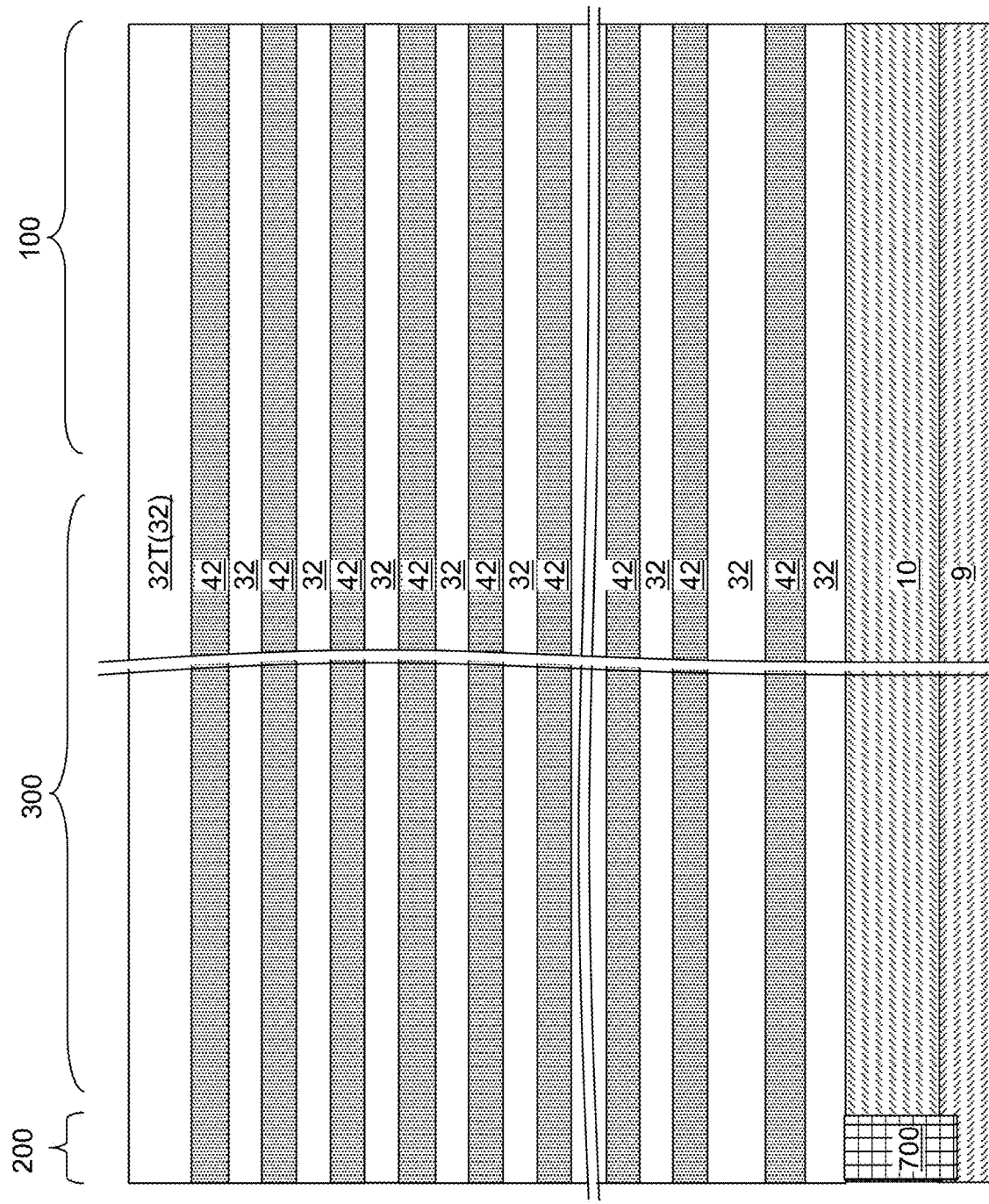
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD). The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

The topmost layer of the alternating stack (32, 42) can be an insulating layer, which is herein referred to as a topmost insulating layer 32T, which can be formed over the alternating stack (32, 42). The topmost insulating layer 32T can have a greater thickness than each of the insulating layers 32. The topmost insulating layer 32T can be deposited, for example, by chemical vapor deposition. In one embodiment, the topmost insulating layer 32T can be a silicon oxide layer.

Figure 3:
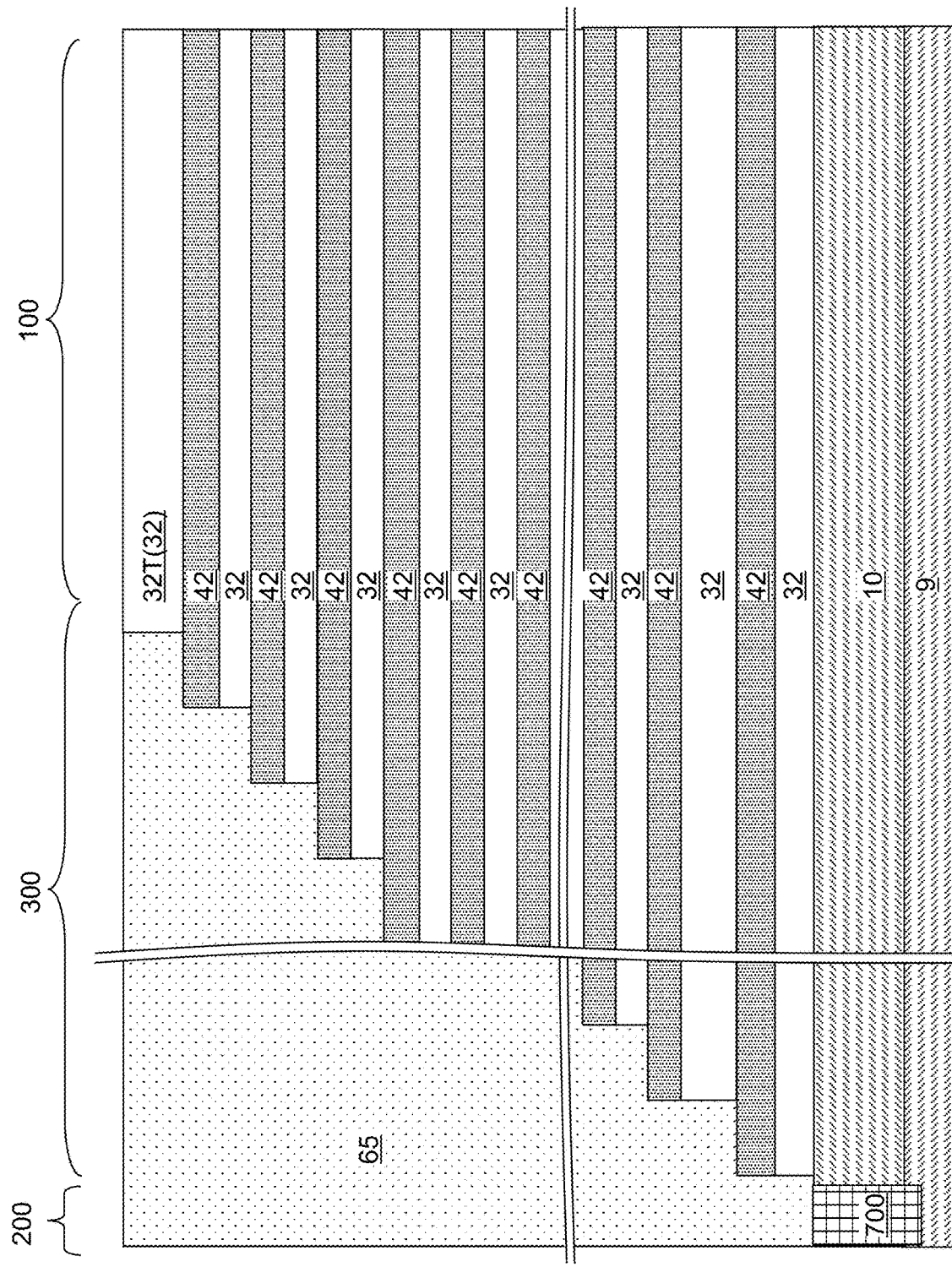
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the topmost insulating layer 32T and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the topmost insulating layer 32T.

Figure 4A:
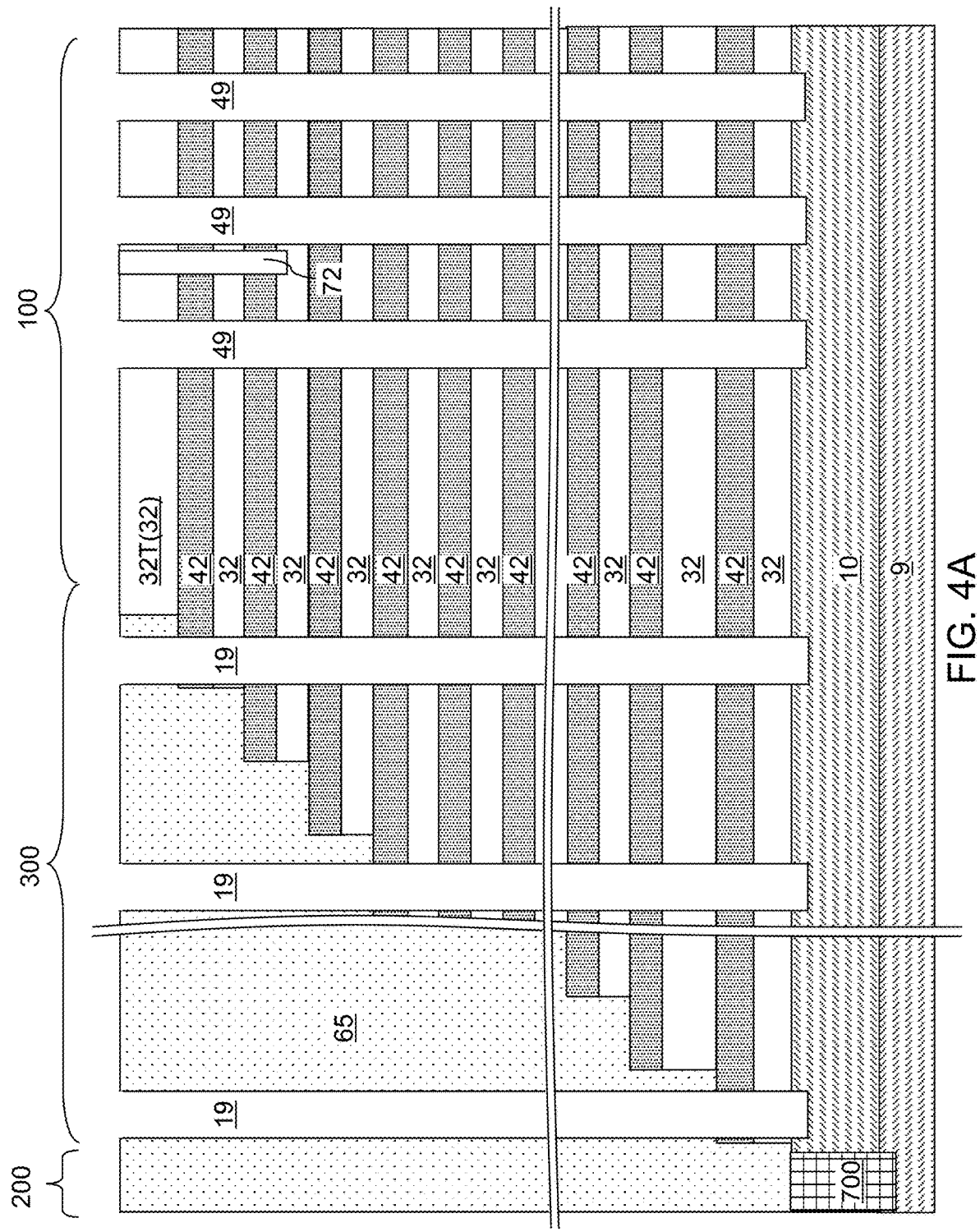
FIG. 4A is a schematic vertical cross-sectional view of the first exemplary structure after formation of memory openings and support openings according to the first embodiment of the present disclosure.
Figure 4B:
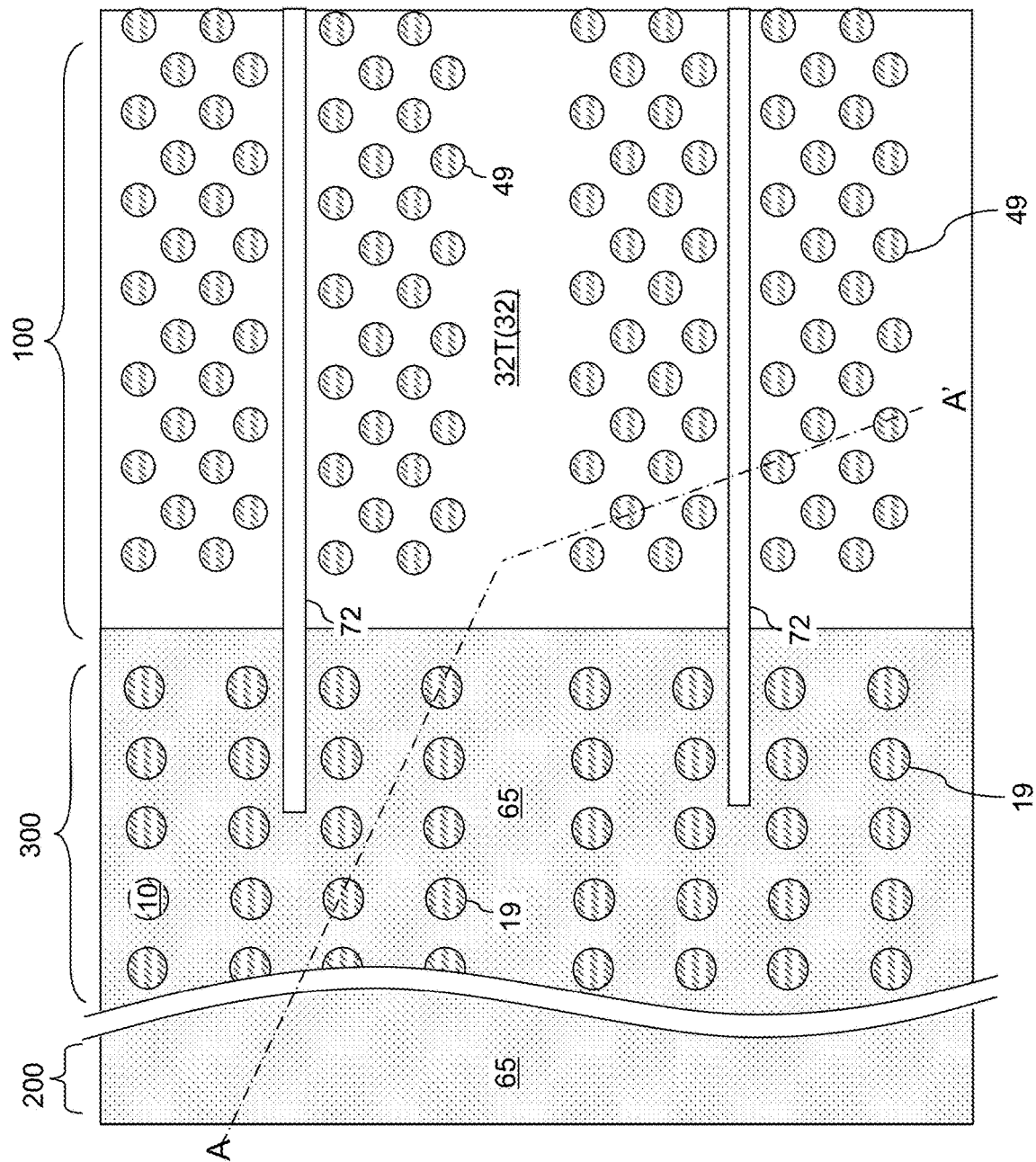
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the topmost insulating layer 32T or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the topmost insulating layer 32T, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 5C:
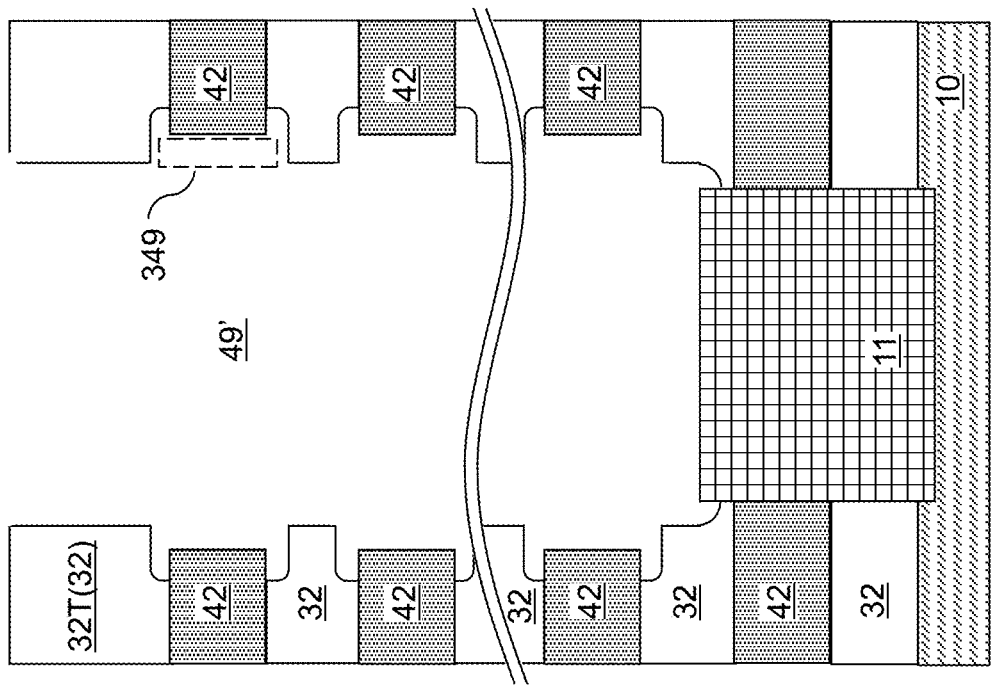

Referring to FIG. 5C, the spacer material layers (such as the sacrificial material layers 42) are laterally recessed selective to the insulating layers 32 by a first isotropic etch process to form annular recess regions 349. The first isotropic etch process can laterally recess sidewalls of the spacer material layers (such as the sacrificial material layers 42) relative to sidewalls of the insulating layers 32 around each memory opening 49. In one embodiment, the first isotropic etch process may include a wet etch process. For example, if the insulating layers 32 include a silicon oxide material and if the sacrificial material layers 42 include silicon nitride, a wet etch process employing hot phosphoric acid can be employed to selectively etch the material of the sacrificial material layers 42 selective to the material of the insulating layers 32. The lateral recess distance of the first isotropic etch process can be in a range from 10 nm to 100 nm, such as from 20 nm to 50 nm, although lesser and greater lateral recess distances can also be employed.

Figure 5D:
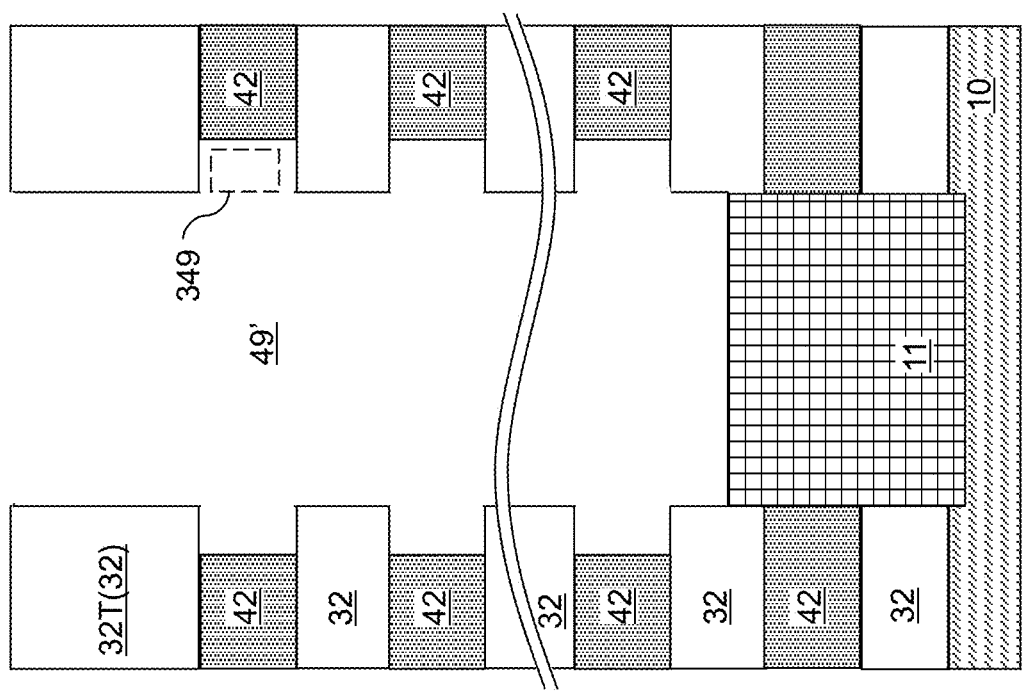

Referring to FIG. 5D, the insulating layers 32 can optionally be isotropically recessed selective to the spacer material layers (such as the sacrificial material layers 42) by a second isotropic etch process. Surfaces of the insulating layers 32 are isotropically trimmed to form annular grooves that are laterally bounded by a concave surface of a respective insulating layer 32 and vertically bounded by a horizontal surface of a respective spacer material layer (such as a sacrificial material layer 42). The second isotropic etch process can isotropically recess sidewalls of the insulating layers 32 selective to the material spacer material layers (such as the sacrificial material layers 42) around each memory opening 49. In one embodiment, the second isotropic etch process may include a wet etch process. For example, if the insulating layers 32 include a silicon oxide material and if the sacrificial material layers 42 include silicon nitride, a wet etch process employing dilute hydrofluoric acid can be employed to selectively etch the material of the insulating layers 32 selective to the material of the sacrificial material layers 42. The lateral recess distance of the second isotropic etch process can be less than one half of the vertical thickness of the insulating layers 32, and can be in a range from 2 nm to 12 nm, such as from 3 nm to 8 nm, although lesser and greater lateral recess distances can also be employed. Annular top surfaces of the sacrificial material layers 42 and annular bottom surfaces of the sacrificial material layers 42 can be physically exposed to the annular recess regions. A pair of annular grooves can be adjoined to each annular recess region 349.

Referring to FIG. 5E, a blocking dielectric layer 52 can be conformally deposited on physically exposed surfaces of the insulating layers 32 and the spacer material layers (such as the sacrificial material layers 42). The blocking dielectric layer 52 includes at least one dielectric material, and may include a single dielectric material layer or a stack of a plurality of dielectric material layers. The blocking dielectric layer 52 can have a total thickness that is the same as, greater than, or less than, the isotropic recess distance of the second isotropic etch process of step 5D. In one embodiment, the blocking dielectric layer 52 can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, such as from 2 nm to 6 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

The blocking dielectric layer 52 continuously extends through levels of a plurality of insulating layers 32 and a plurality of sacrificial material layers 42 within the alternating stack (32, 42). The blocking dielectric layer 52 has a laterally undulating vertical cross-sectional profile that conforms to the vertical cross-sectional profile of the alternating stack (32, 42) of the insulating layers 32 and the sacrificial material layers 42. Thus, the blocking dielectric layer 52 comprises laterally-protruding portions that protrude outward at each level of the annular recess regions 349 (and therefore, at each level of the sacrificial material layers 42). Further, a pair of annular ridges can laterally protrude from each laterally-protruding portion of the blocking dielectric layer 52 around each memory opening 49.

The interfaces between the blocking dielectric layer 52 and the insulating layers 32 can include annular horizontal surface portions and annular curved surface portions. A concave annular surface segment of an insulating layer 32 contacts a convex annular surface segment of the blocking dielectric layer 52 at each annular curved surface portion of the interfaces between the blocking dielectric layer 52 and the insulating layers 32. The annular horizontal surface portions of the interfaces can be vertically offset from interfaces between the insulating layers 32 and the sacrificial material layers 42.

In one embodiment, an inner sidewall of the blocking dielectric layer 52 comprises insulating-layer-level sidewall segments located at levels of the insulating layers 32, and annular recessed sidewall segments that are located at levels of the plurality of sacrificial material layers 42 and laterally recessed outward relative to insulating-layer-level sidewall segments.

Referring to FIG. 5F, a first charge trapping material can be conformally deposited in unfilled volumes of the annular recess regions 349 by a conformal deposition process. A conformal charge trapping material layer 53L including the first charge trapping material can be formed. According to an aspect of the present disclosure, the conformal charge trapping material layer 53L includes a charge trapping material having a higher charge trap density than a charge storage layer to be subsequently deposited. In one embodiment, the conformal charge trapping material layer 53L can include a charge trapping dielectric material having a greater charge trap density and greater electron movement/diffusion than stoichiometric silicon nitride. For example, the conformal charge trapping material layer 53L can include aluminum nitride. The conformal charge trapping material layer 53L can be deposited by a conformal deposition process such as a chemical mechanical deposition process or an atomic layer deposition process. The thickness of the conformal charge trapping material layer 53L can be greater than the recess distance of the recessed portions of the physically exposed sidewall of the blocking dielectric layer 52 at levels of the sacrificial material layers 42 relative to the unrecessed portions of the physically exposed sidewall of the blocking dielectric layer 52 at levels of the insulating layers 32. For example, the thickness of the conformal charge trapping material layer 53L can be in a range from 3 nm to 40 nm, such as from 6 nm to 20 nm, although lesser and greater thicknesses can also be employed.

Figure 5H:
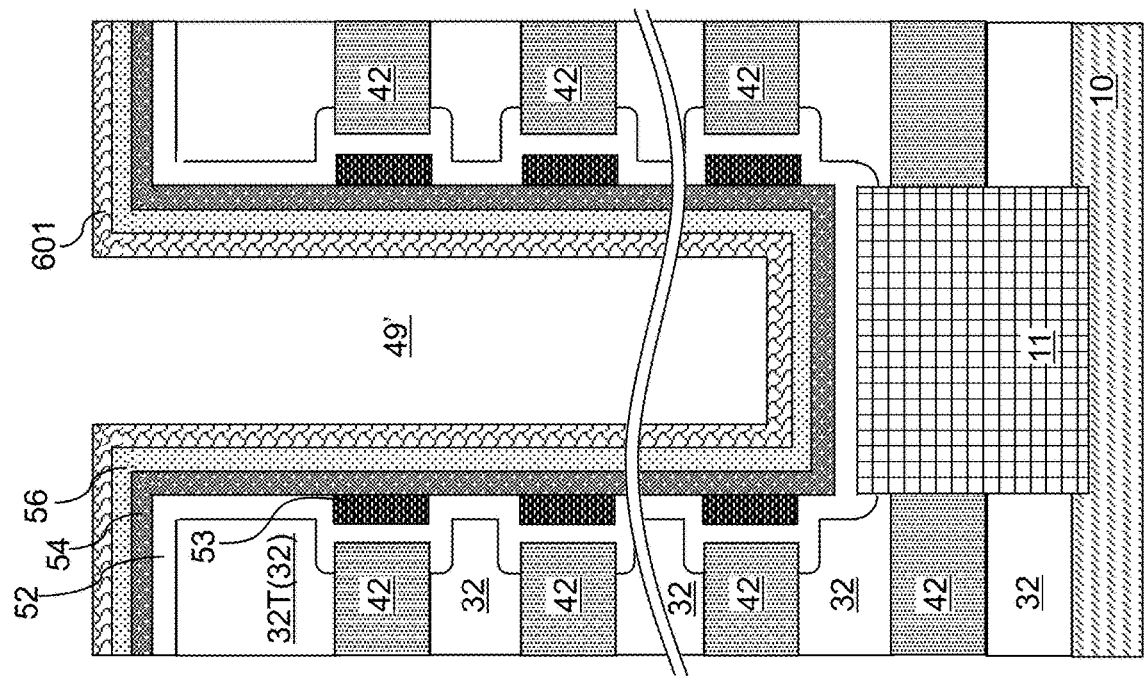
Figure 5G:
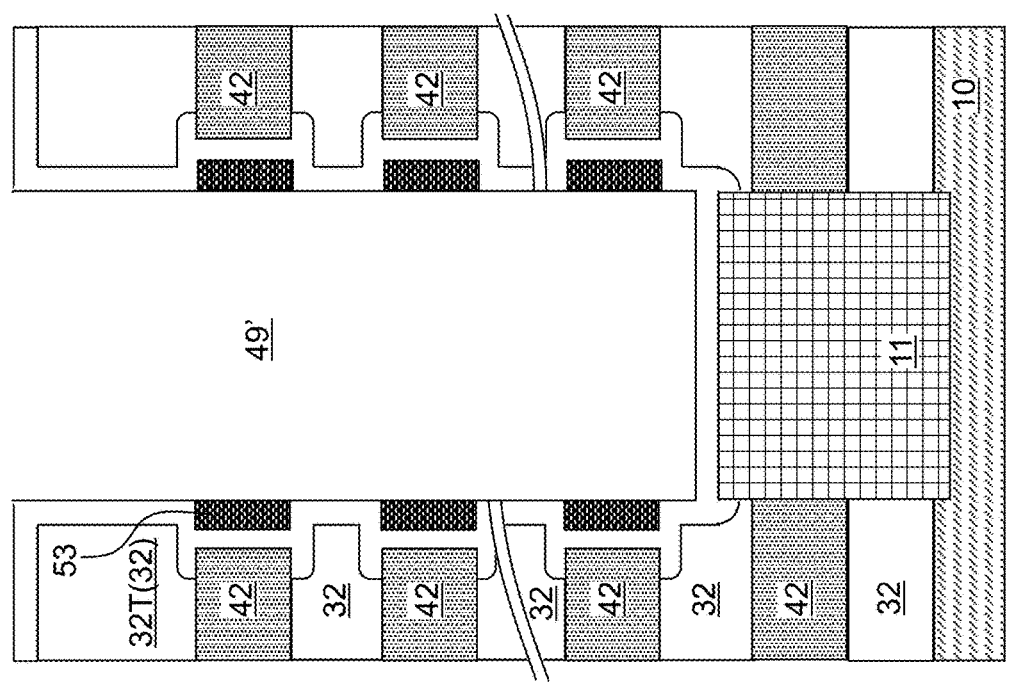

Referring to FIG. 5G, an anisotropic etch process that etches the material of the conformal charge trapping material layer 53L selective to the material of the blocking dielectric layer 52. The anisotropic etch process etches unmasked portions of the first charge trapping material. Portions of the conformal charge trapping material layer 53L that do not underlie an overlying portion of the blocking dielectric layer 52 are removed by the anisotropic etch process. Specifically, portions of the first charge trapping material located inside a cylindrical volume defined by inner sidewall segments of the blocking dielectric layer 52 located at levels of the insulating layers 32 can be removed by the anisotropic etch process. The remaining portions of the first charge trapping material comprise tubular charge storage material portions 53.

A vertical stack of tubular charge storage material portions 53 can be formed within each memory opening 49. Each tubular charge storage material portion 53 includes the first charge trapping material. The tubular charge storage material portions 53 can be located at levels of the sacrificial material layers 42 as discrete material portions that are vertically spaced apart by the insulating layers 32. Each tubular charge storage material portion 53 can have a respective tubular shape with a uniform lateral distance between an inner cylindrical sidewall and an outer cylindrical sidewall. Each tubular charge storage material portion 53 can have a planar annular top surface and a planar annular bottom surface.

Each of the tubular charge storage material portions 53 can be formed within volumes of the annular recess regions 349. The tubular charge storage material portions 53 are formed on the blocking dielectric layer 52. The tubular charge storage material portions 53 can include aluminum nitride.

Referring to FIG. 5H, a continuous charge storage layer 54 including a second charge storage material can be formed by a conformal deposition process. The charge storage layer 54 can be formed as a single charge storage material layer having a homogeneous composition. The second charge storage material can have a lower charge trap density and lower electron movement/diffusion than the first charge storage material. In one embodiment, the charge storage layer 54 includes stoichiometric silicon nitride, i.e., a silicon nitride material having a material composition of $Si_3N_4$. The charge storage layer 54 can be formed as a single continuous layer. The thickness of the charge storage layer 54 can be in a range from 2 nm to 20 nm, such as from 3 nm to 8 nm, although lesser and greater thicknesses can also be employed.

The lower charge trap density of the second charge storage material is advantageous for preventing diffusion of electrical charge (e.g., electrons) from levels of the sacrificial material layers 42 (which are subsequently replaced with electrically conductive layers) to the level of an overlying insulating layer 32 or to the level of an underlying insulating layer 32. The higher charge trap density of the first charge storage material is advantageous for storing more electrical charge (e.g., electrons) during operation of a three-dimensional memory device employing the combination of a vertical stack of discrete (e.g., vertically separated) tubular charge storage material portions 53 and the continuous charge storage layer 54 as a composite charge storage structure (53, 54).

A tunneling dielectric layer 56 can be deposited over the charge storage layer 54. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

An optional first semiconductor channel layer 601 can be formed on the tunneling dielectric layer 56. The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material portions (52, 53, 54, 56, 601).

Figure 5J:
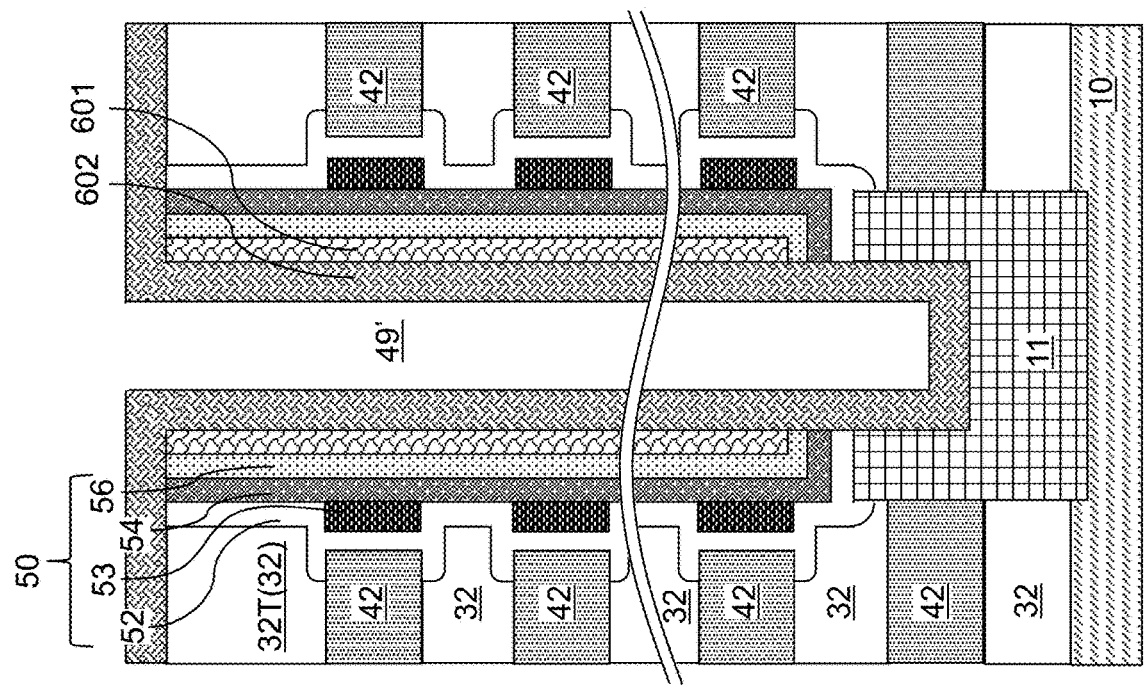
Figure 5I:
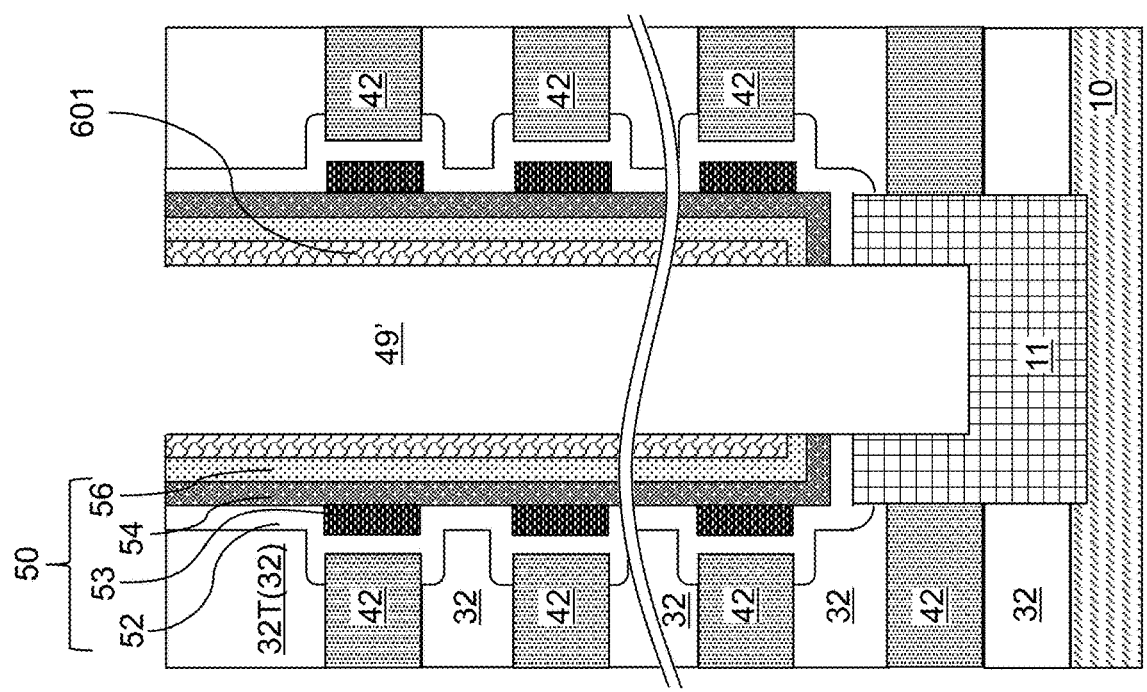

Referring to FIG. 5I, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the topmost insulating layer 32T can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers. Each remaining portion of the first semiconductor channel layer 601 can have a tubular configuration.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a vertical stack of tubular charge storage material portions 53, a charge storage layer 54, and a tunneling dielectric layer 56 in a memory opening 49 constitutes a memory film 50. The combination of the vertical stack of tubular charge storage material portions 53 and the charge storage layer 54 constitutes a composite charge storage structure (53, 54). The composite charge storage structure (53, 54) includes a plurality of charge storage regions that are insulated from surrounding materials by the blocking dielectric layer 52 and the tunneling dielectric layer 56. Each charge storage region can include a respective tubular charge storage material portion 53 and an adjoining portions of the charge storage layer 54 located at a respective level of a sacrificial material layer 42. In one embodiment, the first semiconductor channel layer 601, the tunneling dielectric layer 56, the charge storage layer 54, and the blocking dielectric layer 52 can have vertically coincident sidewalls.

Referring to FIG. 5J, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5K, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5L, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the topmost insulating layer 32T and a second horizontal plane including the bottom surface of the topmost insulating layer 32T. Each remaining portion of the dielectric core layer 62L constitutes a dielectric core 62.

Figure 5M:
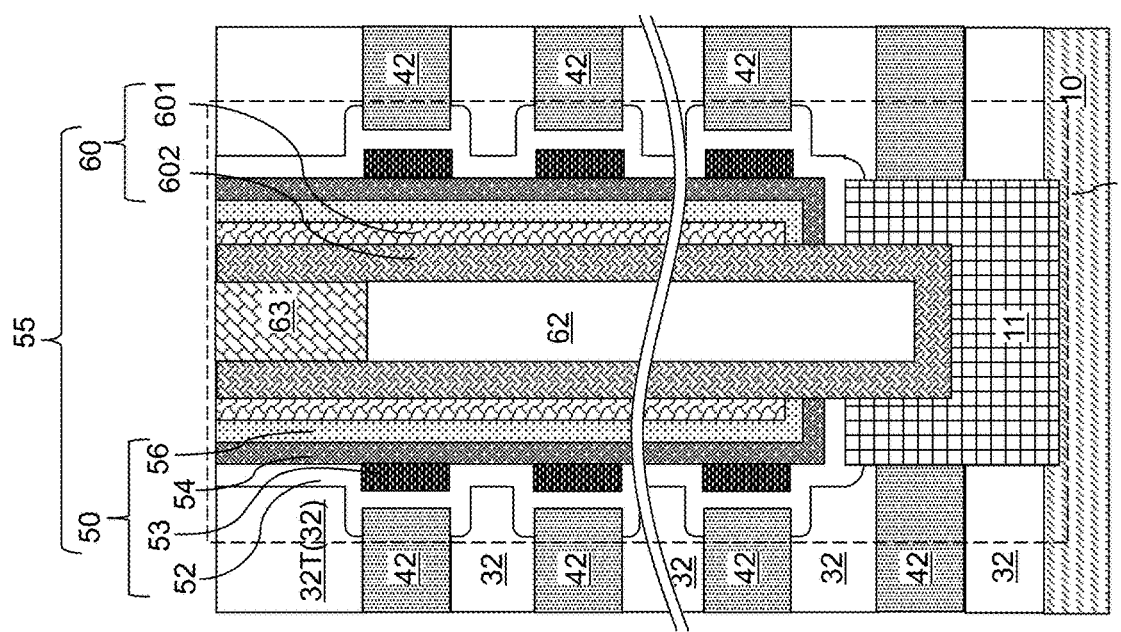

Referring to FIG. 5M, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material can be removed from above the top surface of the topmost insulating layer 32T, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the topmost insulating layer 32T can be concurrently removed by a planarization process. Each remaining portion of the second semiconductor channel layer 602 can be located entirely within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a tunneling dielectric layer 56, a vertical stack of tubular charge storage material portions 53, a charge storage layer 54, and a blocking dielectric layer 52 collectively constitute a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours. In alternative embodiments, a blocking dielectric layer 52 may not be formed in each memory opening 49, and may be subsequently formed in backside recesses that are formed by removal of the sacrificial material layers 42 at a subsequent processing step.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising tubular charge storage material portions 53 and portions of the charge storage layer 54 contacting a respective one of the tubular charge storage material portions 53, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
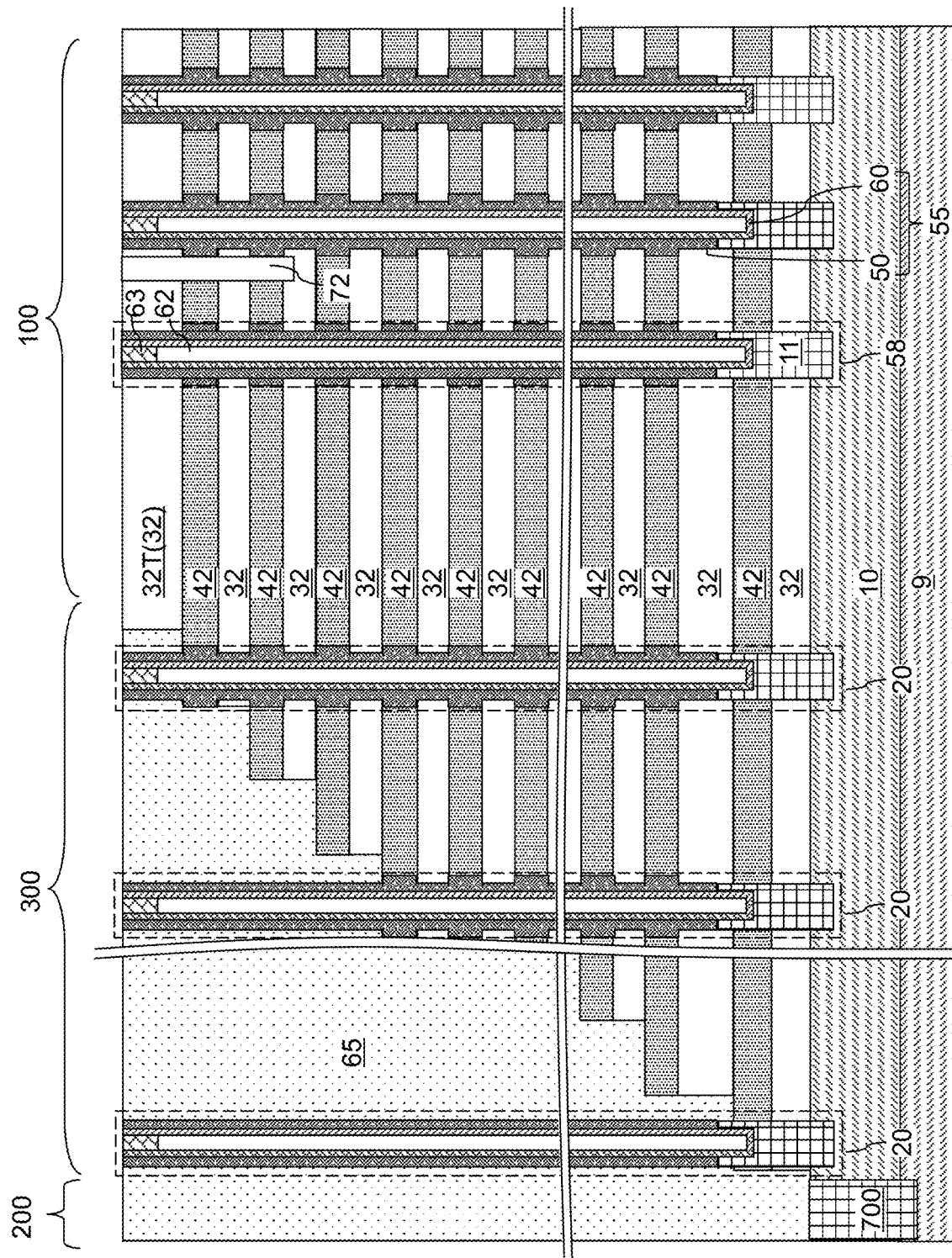
FIG. 6 is a schematic vertical cross-sectional view of the first exemplary structure after formation of memory stack structures and support pillar structures according to the first embodiment of the present disclosure.

Referring to FIG. 6, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage elements (comprising a tubular charge storage material portion 53 and an adjoined portion of a charge storage layer 54) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
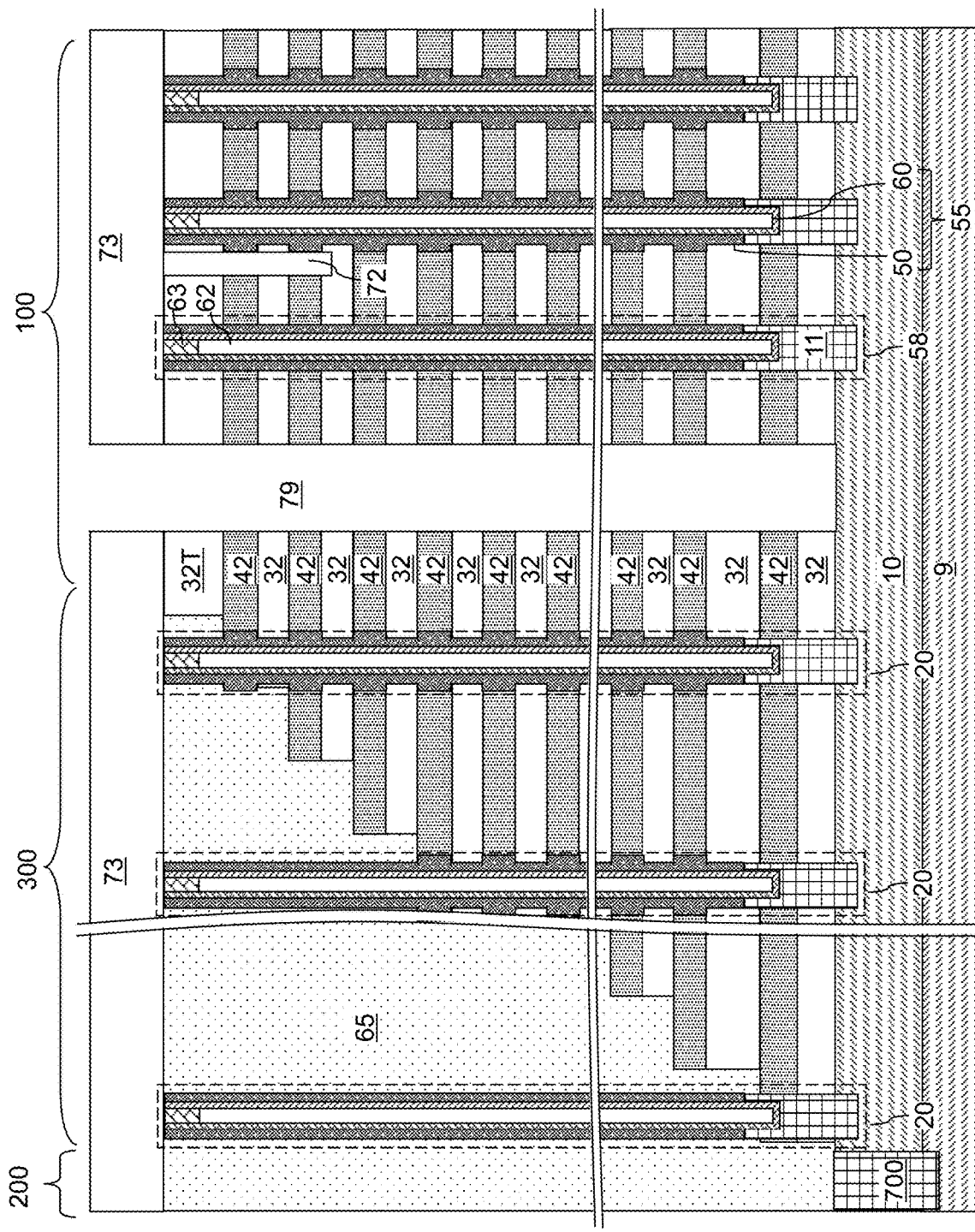
FIG. 7A is a schematic vertical cross-sectional view of the first exemplary structure after formation of backside trenches according to the first embodiment of the present disclosure.
Figure 7C:
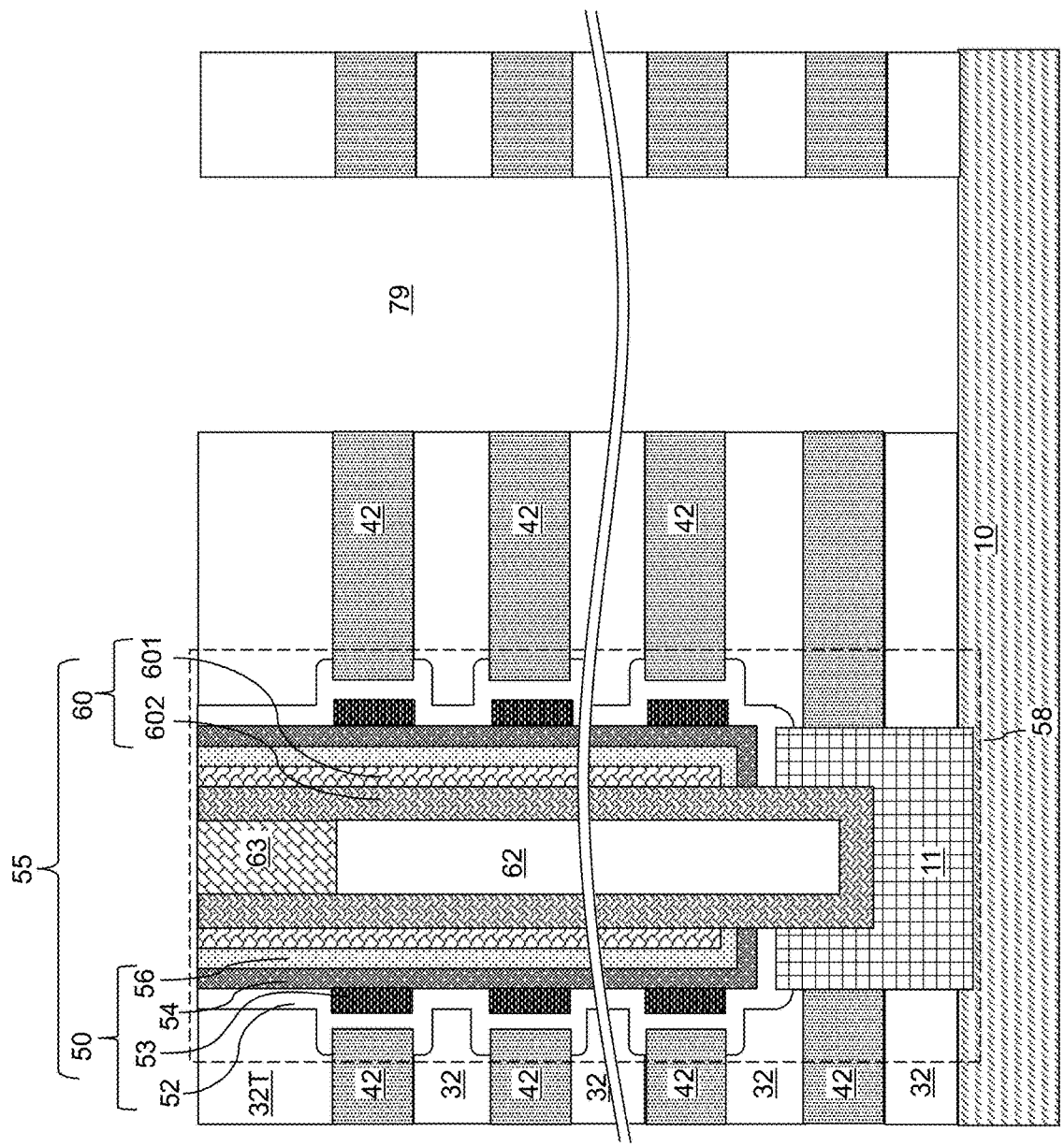
FIG. 7C is a schematic vertical cross-sectional view along the vertical plane C-C' of FIG. 7B.

Referring to FIGS. 7A-7C, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart from each other along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
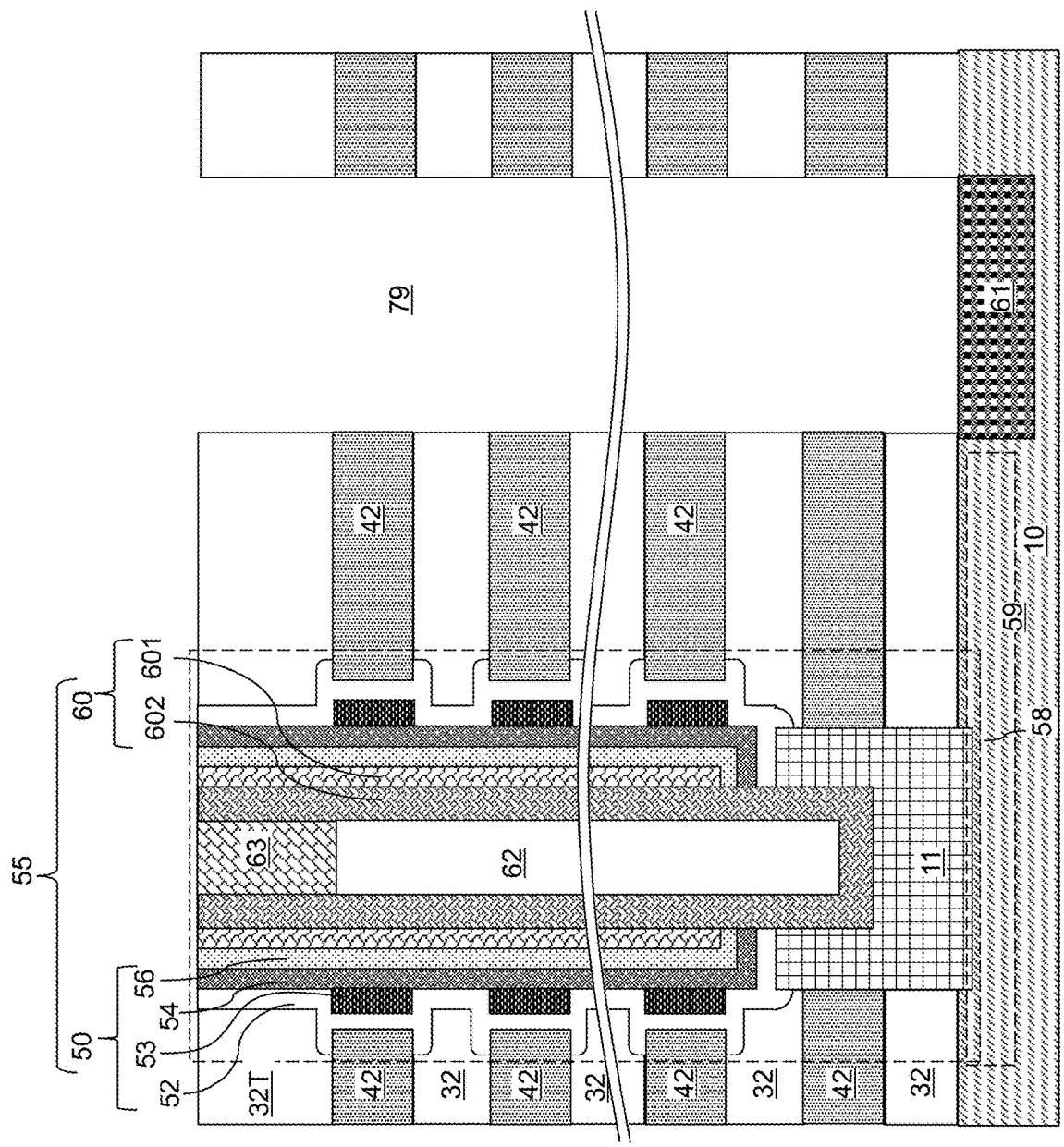
FIG. 8 is a schematic vertical cross-sectional view of a region the first exemplary structure after formation of source regions according to the first embodiment of the present disclosure.

Referring to FIG. 8, dopants of the second conductivity type can be implanted into portions of the semiconductor material layer 10 that underlie the backside trenches 79 to form source regions 61. The atomic concentration of the dopants of the second conductivity type in the source regions 61 can be in a range from $5.0 \times 10^{19}/cm^3$ to $2.0 \times 10^{21}/cm^3$, although lesser and greater atomic concentrations can also be employed. Surface portions of the semiconductor material layer 10 that extend between each source region 61 and adjacent memory opening fill structures 58 comprise horizontal semiconductor channels 59. In other embodiments, rather than forming the source regions 61 in the semiconductor material layer 10, a horizontal source layer (e.g., buried source layer) which contacts a sidewalls of the semiconductor channel may be formed as described in U.S. Pat. No. 10,559,582 B1, incorporated herein by reference in its entirety. In this configuration, the semiconductor devices 700 (e.g., CMOS devices) for the peripheral circuitry may be formed under the alternating stack (32, 42) in a CMOS under array configuration. Alternatively, the semiconductor devices 700 (e.g., CMOS devices) for the peripheral circuitry may be formed on a separate substrate which is then bonded to the memory device in a CMOS bonded to array configuration.

Figure 9A:
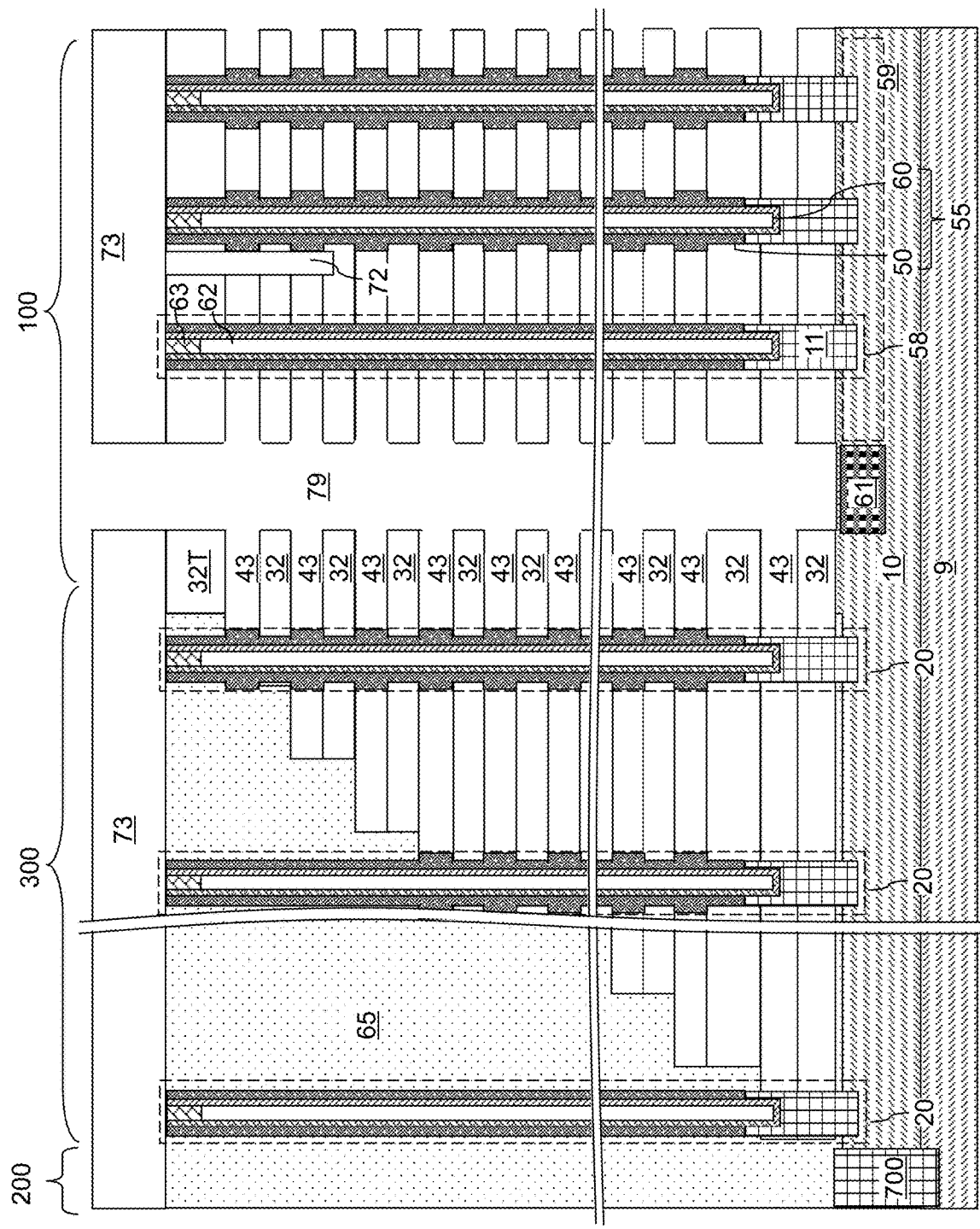
FIG. 9A is a schematic vertical cross-sectional view of the first exemplary structure after formation of backside recesses according to the first embodiment of the present disclosure.
Figure 9B:
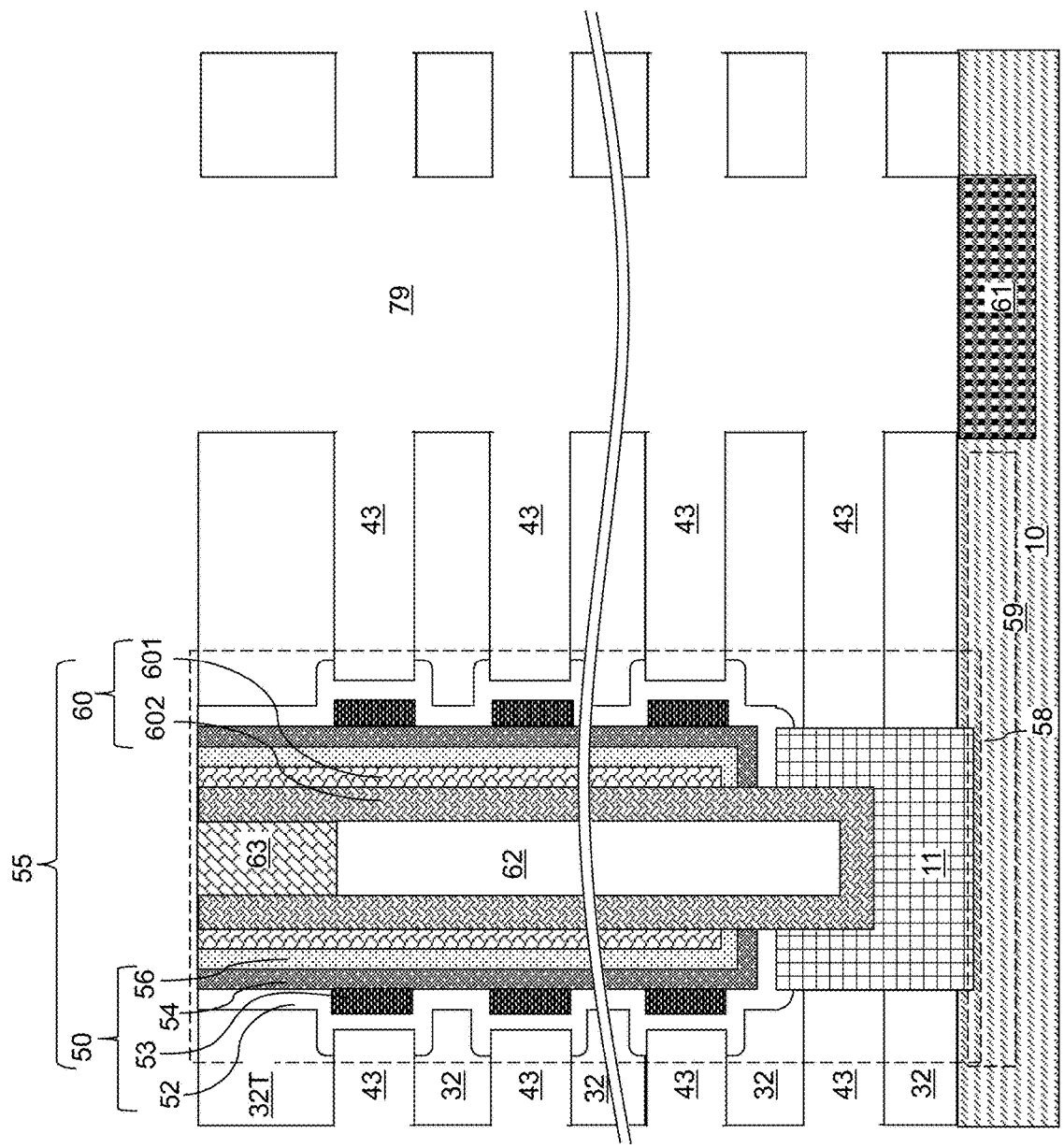
FIG. 9B is a schematic vertical cross-sectional view of a region the first exemplary structure of FIG. 9A.

Referring to FIGS. 9A and 9B, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 10A:
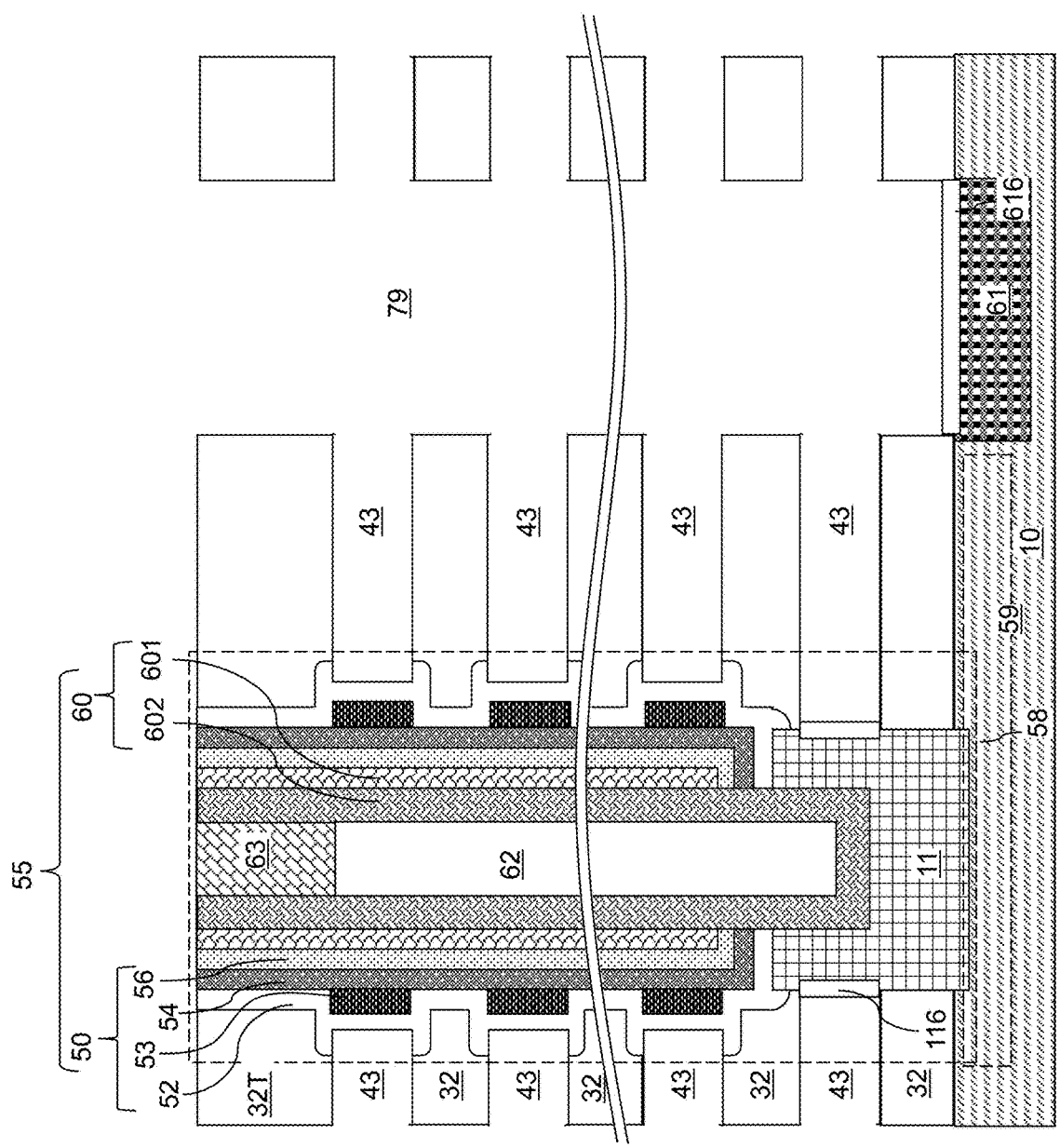
FIGS. 10A-10C are sequential vertical cross-sectional views of a region of the first exemplary structure during formation of electrically conductive layers according to the first embodiment of the present disclosure.

Referring to FIG. 10A, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10. Dopants in the drain regions 63, the source regions 61, and the semiconductor channels 60 can be activated during the anneal process that forms the planar dielectric portions 616 and the tubular dielectric spacers 116. Alternatively, an additional anneal process may be performed to active the electrical dopants in the drain regions 63, the source regions 61, and the semiconductor channels 60.

Figure 10B:
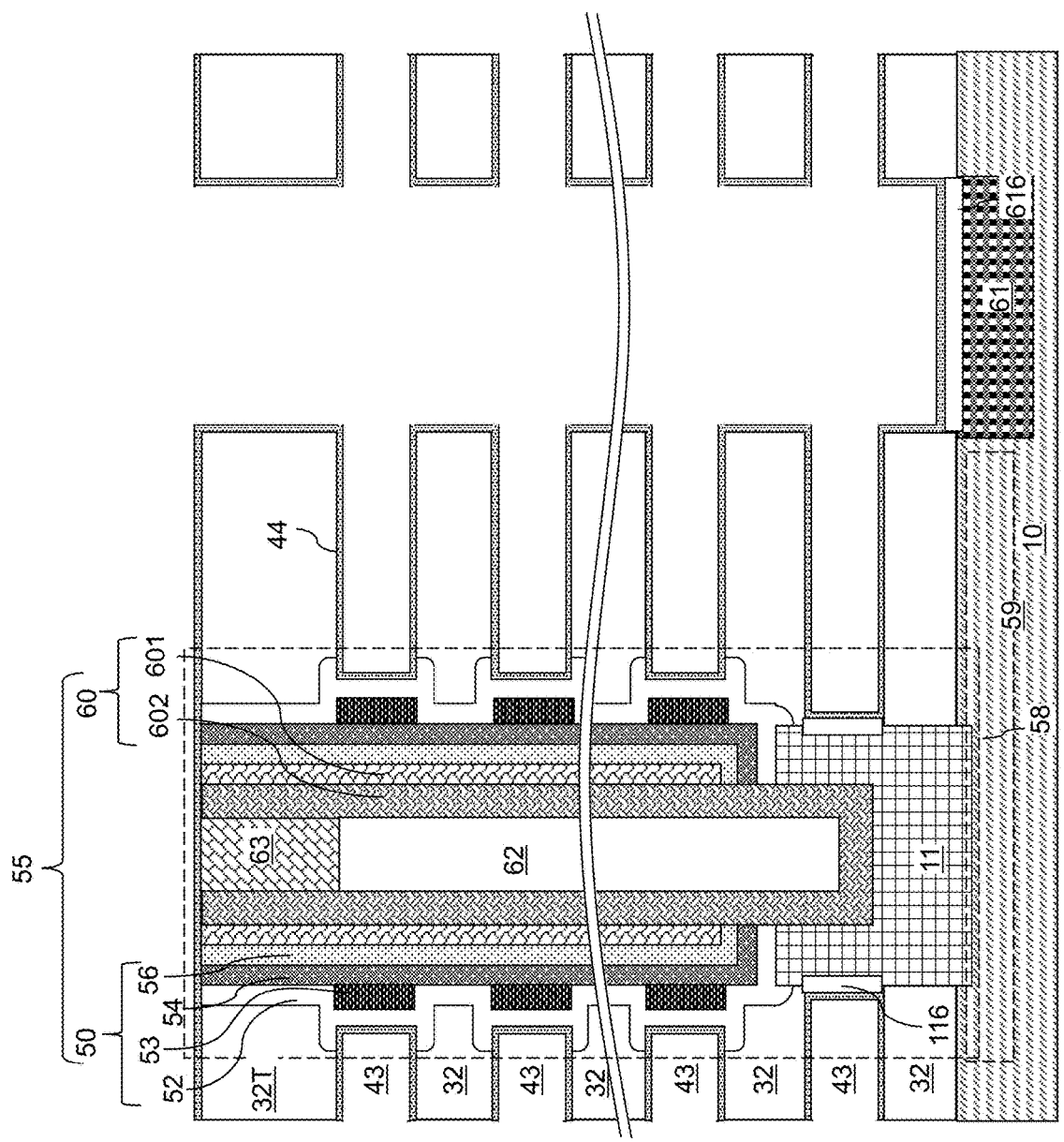

Referring to FIG. 10B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 10C:
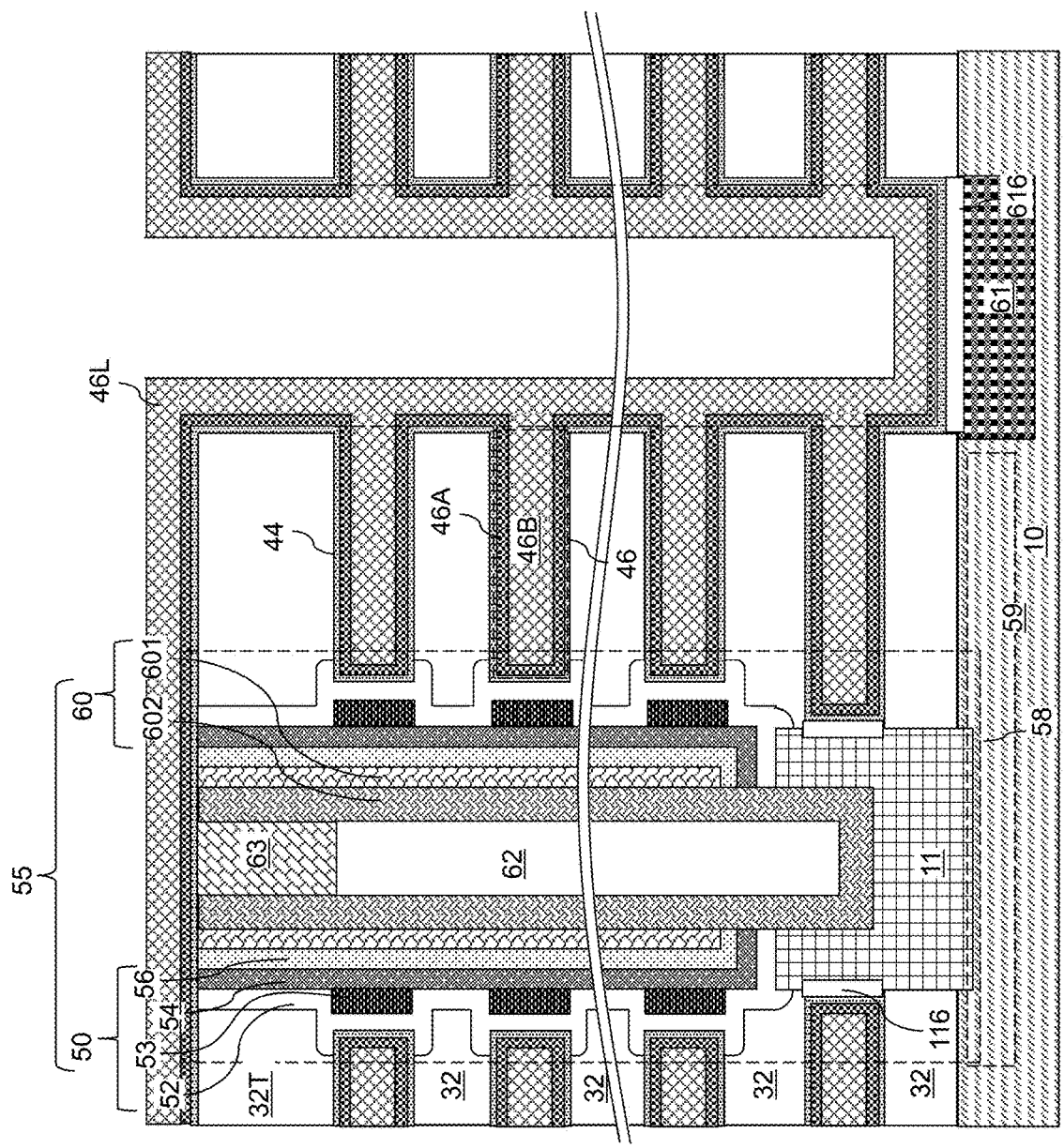

Referring to FIG. 10C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
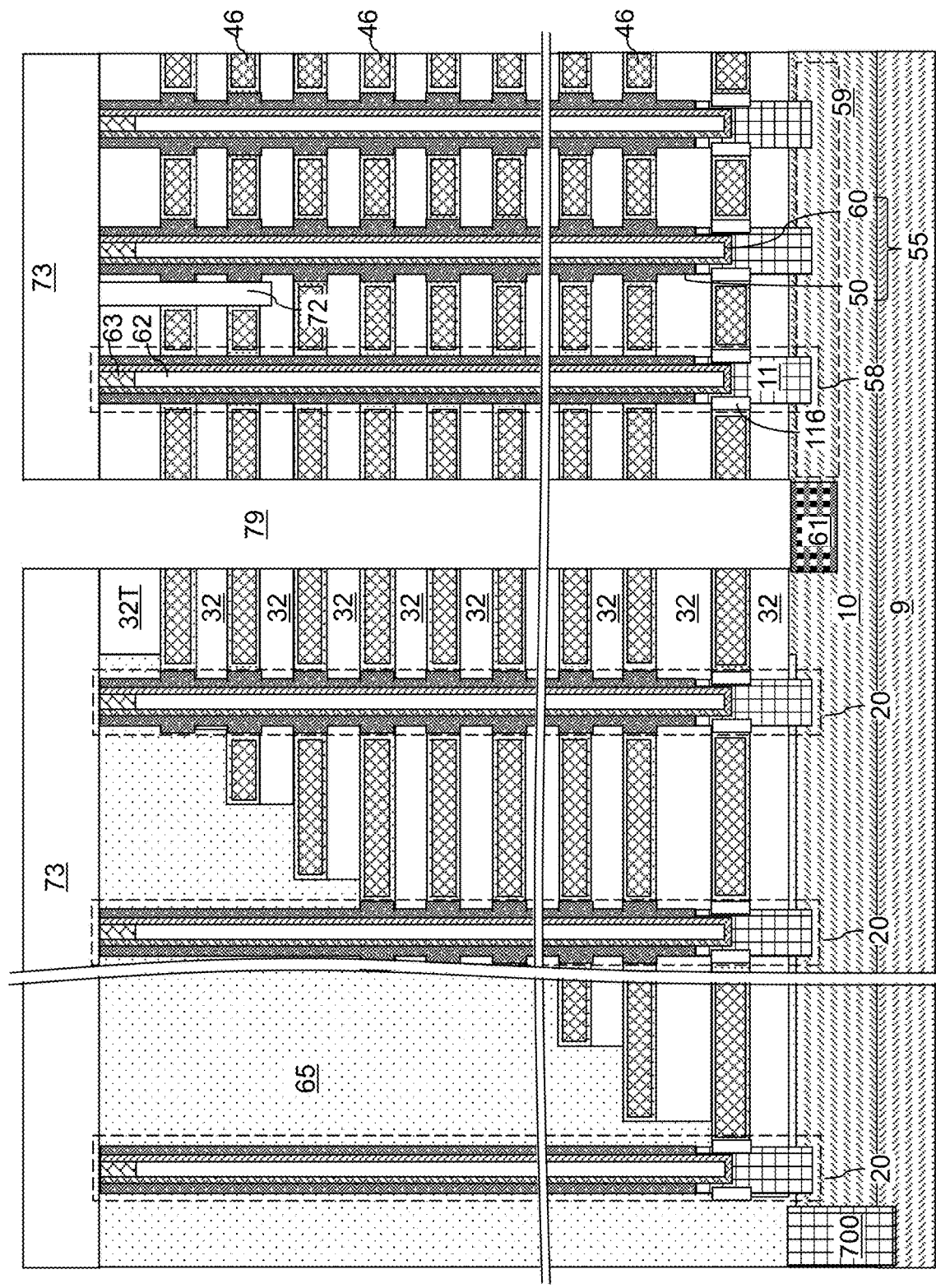
FIG. 11A is a schematic vertical cross-sectional view of the first exemplary structure after removal of a deposited conductive material from within the backside trenches according to the first embodiment of the present disclosure.
Figure 11B:
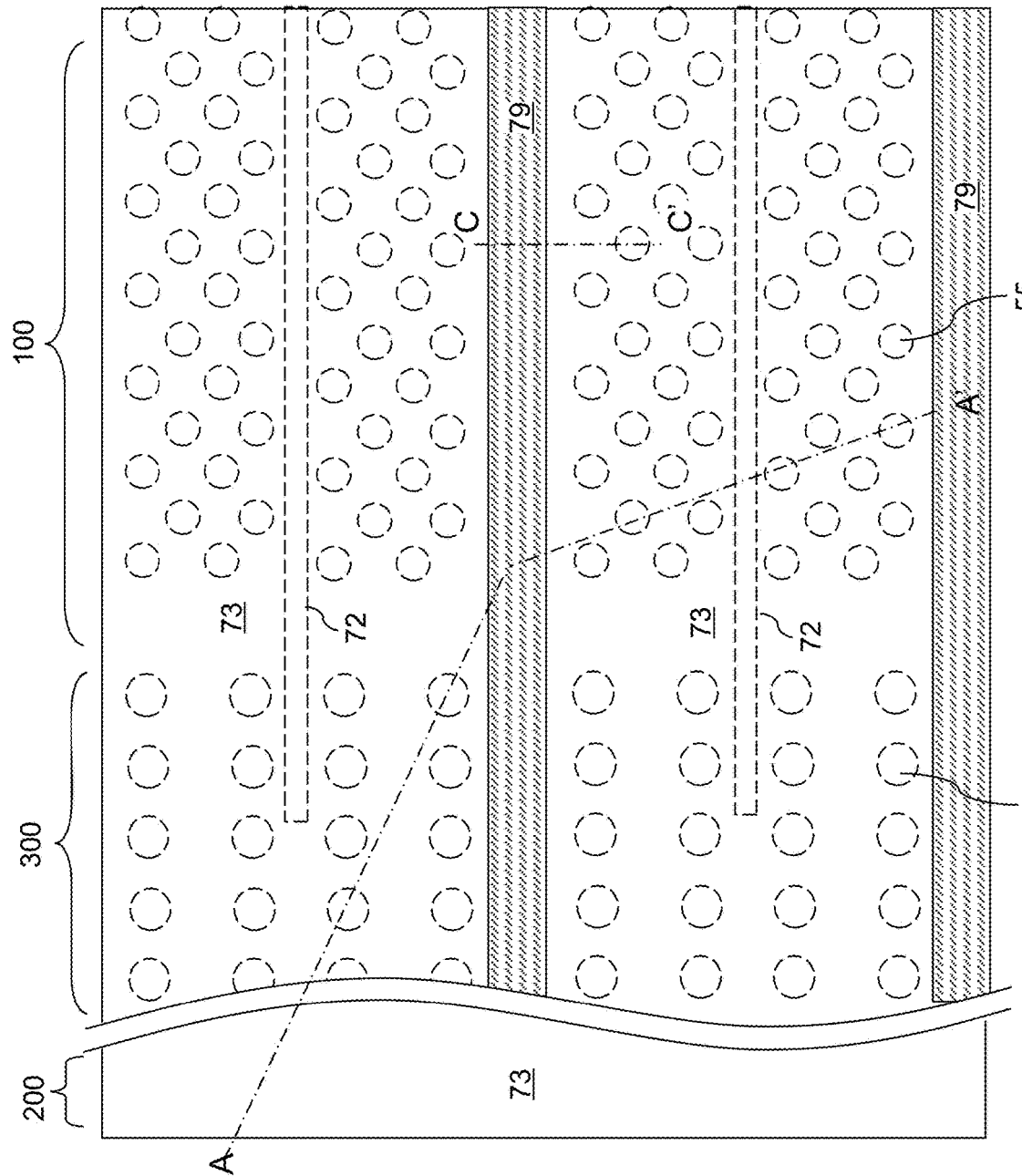
FIG. 11B is a partial see-through top-down view of the first exemplary structure of FIG. 11A. The vertical plane A-A' is the plane of the schematic vertical cross-sectional view of FIG. 11A.
Figure 11C:
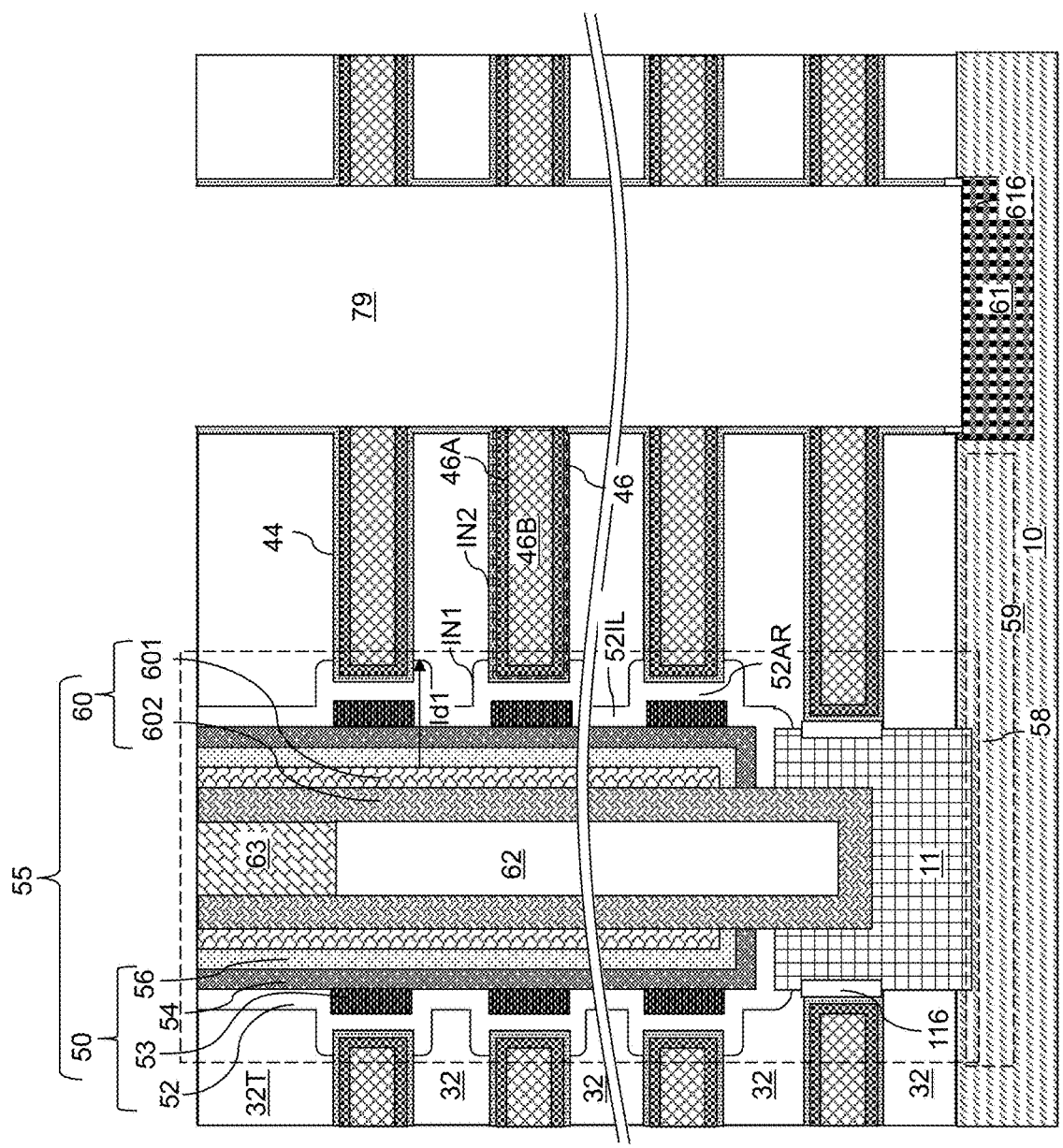
FIG. 11C is a vertical cross-sectional view of the first exemplary structure along the vertical plane C-C' of FIG. 11B.

Referring to FIGS. 11A-11C, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

In one embodiment shown in FIG. 11C, outermost surfaces of the blocking dielectric layer 52 within each memory opening 49 can be laterally offset from the vertical semiconductor channel within the respective memory opening 49 by a first lateral distance ld1. The annular horizontal surface portions of the first interfaces IN1 between the blocking dielectric layer 52 and the insulating layers 32 can be vertically offset from horizontal surface portions of the second interfaces IN2 between the electrically conductive layers 46 and the insulating layers 32. The horizontal surfaces of portions of the insulating layers 32 which make up the second interfaces IN2 are laterally offset from the vertical semiconductor channel 60 by a lateral distance that is greater than the first lateral distance ld1.

Backside blocking dielectric layers 44 can be located between each of the electrically conductive layers 46 and a combination of the blocking dielectric layer 52, a respective underlying one of the insulating layers 32, and a respective overlying one of the insulating layers 32.

Figure 12:
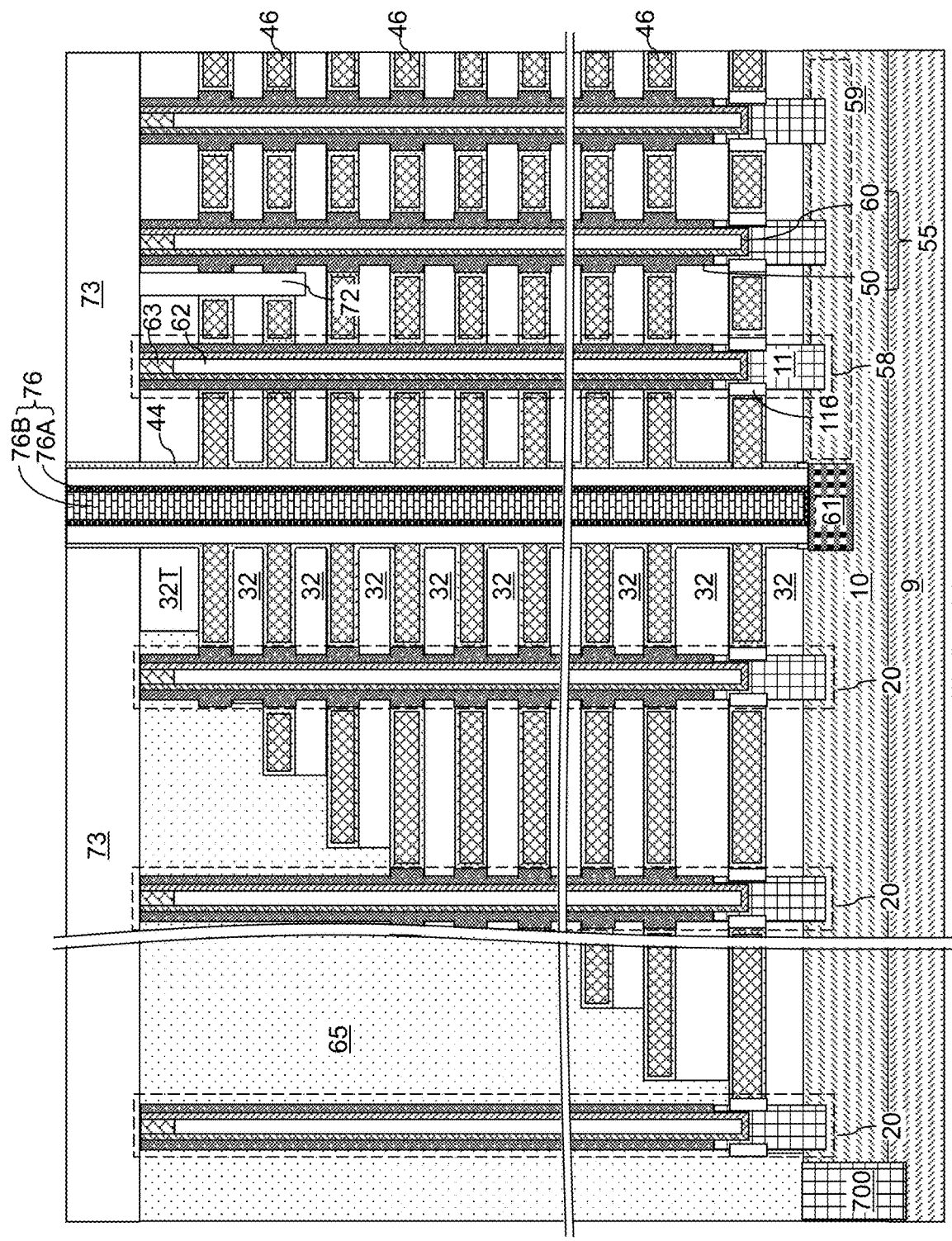
FIG. 12 is a schematic vertical cross-sectional view of the first exemplary structure after formation of an insulating spacer and a backside contact structure within each backside trench according to the first embodiment of the present disclosure.

Referring to FIG. 12, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 13A:
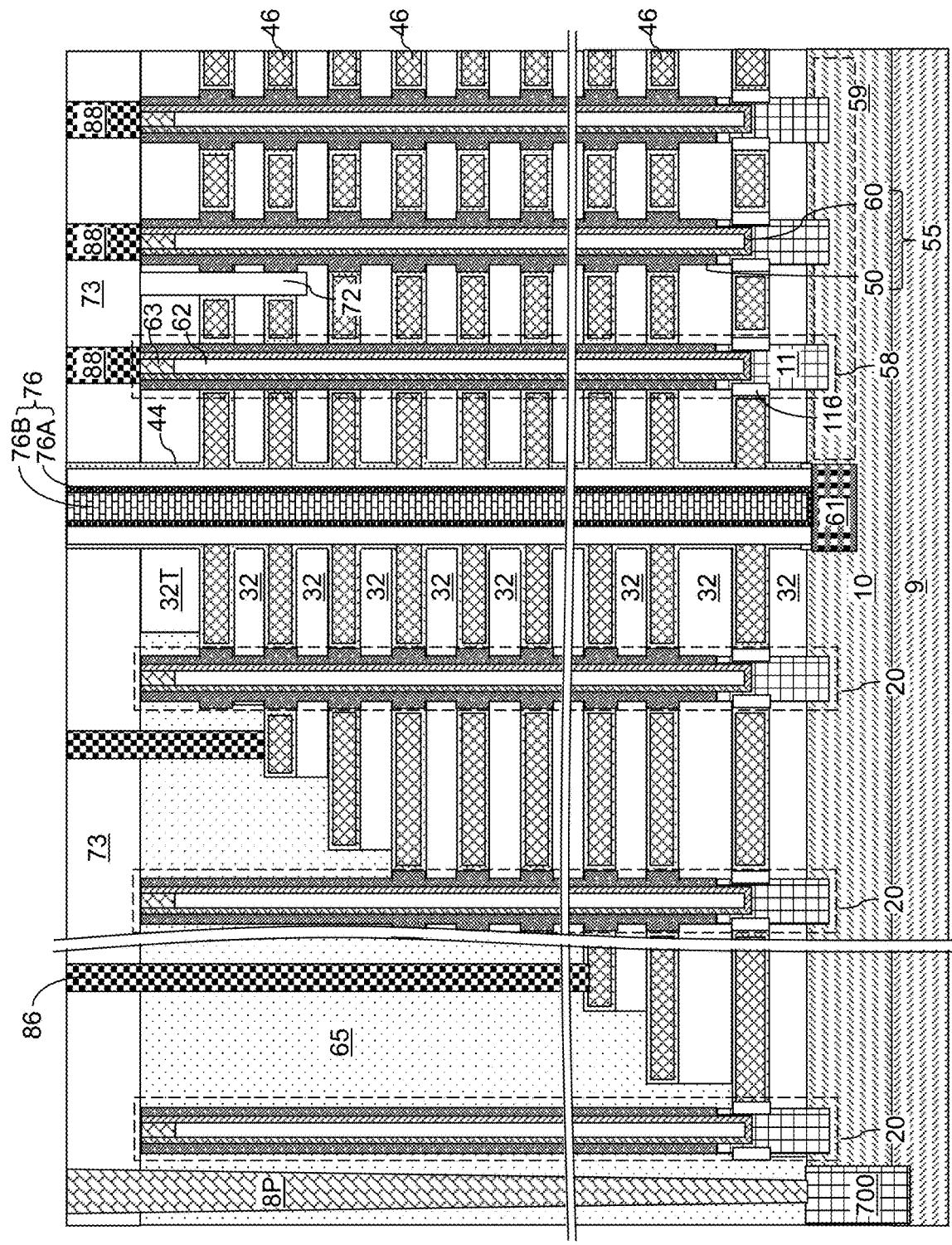
FIG. 13A is a schematic vertical cross-sectional view of the first exemplary structure after formation of additional contact via structures according to the first embodiment of the present disclosure.
Figure 13B:
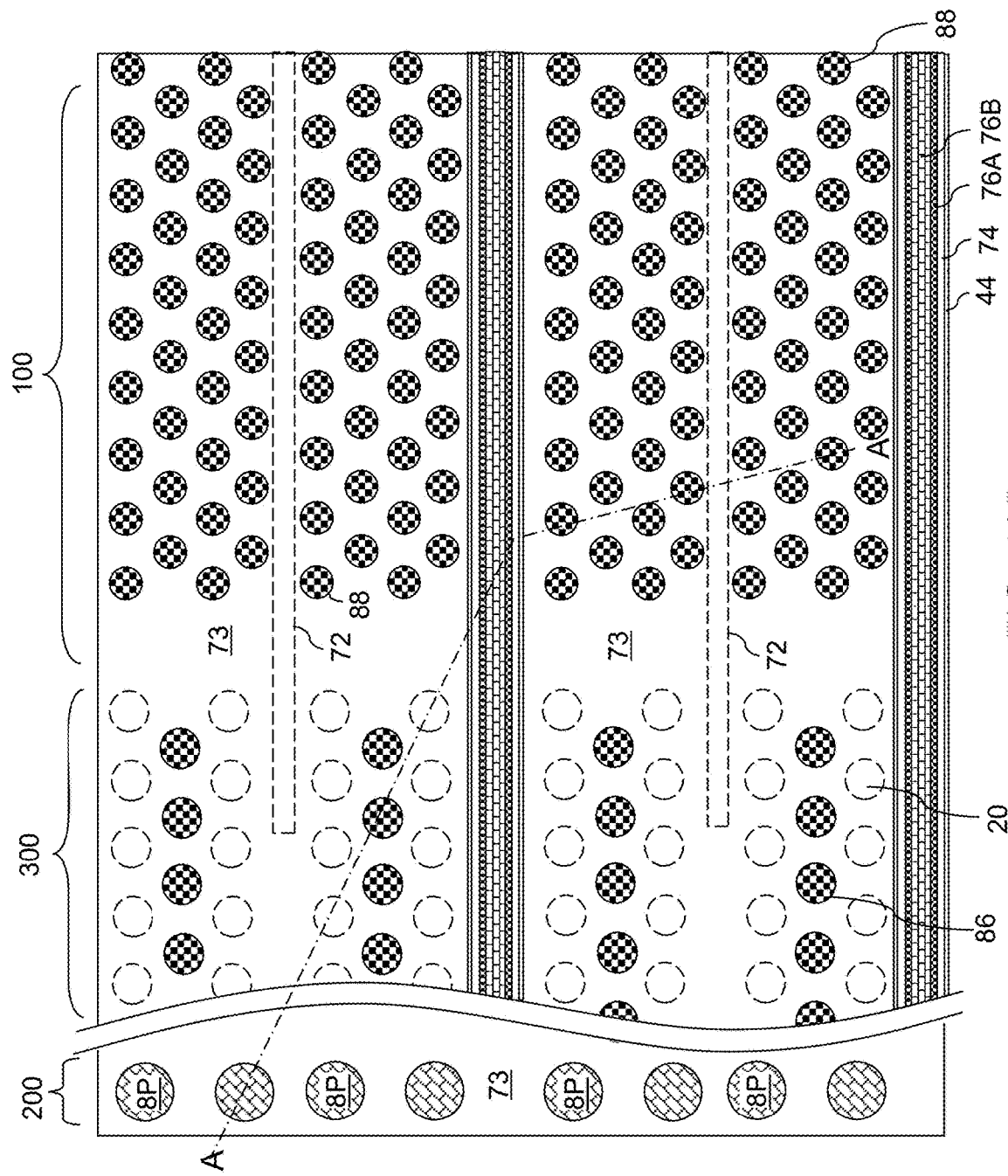
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Referring to FIGS. 1-13B and according to the first embodiment of the present disclosure, a memory device comprises an alternating stack of insulating layers 32 and electrically conductive layers 46 located over a substrate (9, 10); and a memory stack structure 55 extending through the alternating stack (32, 46), wherein the memory stack structure 55 comprises a composite charge storage structure (53, 54), a tunneling dielectric layer 56 located on an inner sidewall of the composite charge storage structure (53, 54), and a vertical semiconductor channel 60 contacting an inner sidewall of the tunneling dielectric layer 56. The composite charge storage structure (53, 54) comprises a vertical stack of discrete tubular charge storage material portions 53 including a first charge trapping material located at levels of the electrically conductive layers 46 and vertically spaced apart from each other, and a continuous charge storage layer 54 including a second charge trapping material extending through a plurality of the electrically conductive layers 46. The first charge trapping material has a higher charge trap density than the second charge trapping material.

In one embodiment, each of the tubular charge storage material portions 53 contacts a portion of an outer sidewall of the charge storage layer 54. In one embodiment, the entirety of an inner sidewall of the charge storage layer 54 contacts an outer sidewall of the tunneling dielectric layer 56.

In one embodiment, the memory device comprises a blocking dielectric layer 52 that continuously extends through the plurality of electrically conductive layers 46 and laterally surrounds the composite charge storage structure (53, 54) and located within a same memory opening 49.

In one embodiment, the blocking dielectric layer 52 comprises laterally-protruding portions that protrude outward from the composite charge storage structure (53, 54) at each level of the plurality of electrically conductive layers 46. Interfaces IN1 between the blocking dielectric layer 52 and the insulating layers 32 include annular horizontal surface portions. In one embodiment illustrated in FIG. 11C, the outermost surfaces of the blocking dielectric layer 52 can be laterally offset from the vertical semiconductor channel 60 by a first lateral distance ld1, and the annular horizontal surface portions of the interfaces IN1 can be vertically offset from horizontal surfaces of portions of the insulating layers 32 which form the interfaces IN2 with the electrically conductive layers 46. The vertical offset distance between the annular horizontal surface portions of the interfaces IN1 and a most proximal horizontal plane including horizontal surfaces of portions of the insulating layers 32 of interfaces IN2 (which are laterally offset from the vertical semiconductor channel 60 by a lateral distance that is greater than the first lateral distance ld1) can be the same as the recess distance of the second isotropic etch process of FIG. 5D.

In one embodiment, a metal oxide backside blocking dielectric layer 44 can be located between the blocking dielectric layer 52 which comprises silicon oxide and each of the electrically conductive layers 46.

In one embodiment shown in FIG. 11C, an inner sidewall of the blocking dielectric layer 52 comprises insulating-layer-level sidewall segments 521L located at levels of the insulating layers 32, and annular recessed sidewall segments 52AR that are located at levels of the plurality of electrically conductive layers 46 and laterally recessed outward relative to insulating-layer-level sidewall segments. In one embodiment, the tubular charge storage material portions 53 are vertically spaced apart from each other by the insulating-layer-level sidewall segments 521L of the blocking dielectric layer 52. In one embodiment, each of the tubular charge storage material portions 53 contacts a respective one of the annular recessed sidewall segments 52AR and has a respective inner sidewall that is vertically coincident with an overlying one of the insulating-layer-level sidewall segments 521L of the blocking dielectric layer 52.

In one embodiment, each inner sidewall of the tubular charge storage material portions 53 can be vertically coincident with the segments of the inner sidewall of the blocking dielectric layer 52 that are located at levels of the insulating layers 32. In one embodiment, the entirety of an outer sidewall of the charge storage layer 54 can be straight in a vertical cross-sectional view that passes through a geometrical center of the volume of the memory opening fill structure 58.

In one embodiment, the first charge storage material comprises, and/or consists essentially of, aluminum nitride and the second charge storage material comprises, and/or consists essentially of, silicon nitride.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46); the terrace region includes stepped surfaces of the alternating stack (32, 46); and support pillar structures 20 extend through the stepped surfaces and through a retro-stepped dielectric material portion 65 that overlies the stepped surfaces.

The first embodiment of the present disclosure provides a composite charge storage structure (53, 54) within each memory opening 49. Each composite charge storage structure (53, 54) includes discrete portions 53 of a first charge storage material having a high charge trap density and high electron mobility at each level of the electrically conductive layers 46 comprising the tubular charge storage material portions 53. The first charge storage material of the tubular charge storage material portions 53 provides high programming speed, and stores a high density of electrical charge (e.g., electrons). The high electron mobility of the first charge storage material does not induce high charge leakage which degrades data retention because this material is confined in discrete portions 53 at level of a respective electrically conductive layer 46. However, if the discrete portions 53 are used alone, then they may degrade the program slope.

Therefore, a continuous charge storage layer 54 is added at levels of the insulating layers 32 and the electrically conductive layers 46 to link up the discrete portions 53 in the composite charge storage structure (53, 54) to improve the program slope. The continuous charge storage layer 54 includes a second charge storage material having a lower charge trap density and a lower electron mobility than the first charge storage material. As such, electron leakage within the composite charge storage structure (53, 54) between neighboring memory cells is reduced, and data retention is not significantly degraded by the continuous charge storage layer 54. Thus, the composite charge storage structure (53, 54) can provide both improved programming speed and data (i.e., charge) retention characteristics without degrading the program slope for the memory stack structure 55.

Figure 14A:
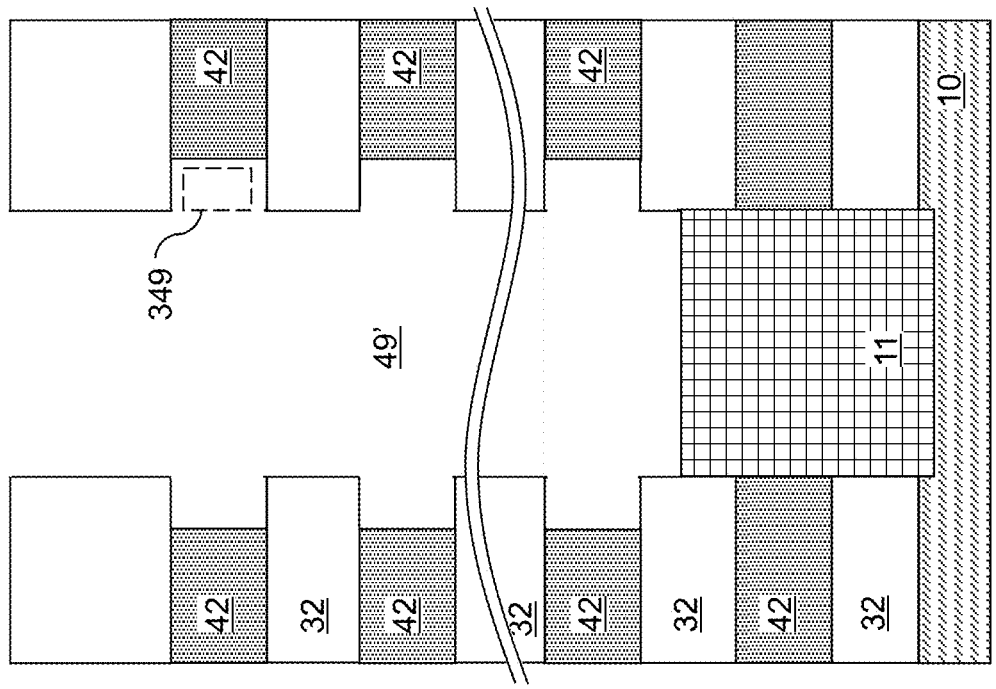

Referring to FIG. 14A, a region of a second exemplary structure according to a second embodiment of the present disclosure is illustrated, which illustrates a memory opening 49 extending through an alternating stack of insulating layers 32 and sacrificial material layers 42. The insulating layers 32 can include silicon oxide, and the sacrificial material layers 42 can include silicon nitride or a silicon-containing material such as amorphous silicon or polysilicon. The second exemplary structure of FIG. 14A can be derived from the first exemplary structure of FIGS. 4A and 4B by performing the processing steps of FIG. 5B, i.e., by forming an optional pedestal channel portion (e.g., an epitaxial pedestal) 11 at the bottom portion of each memory opening 49 and each support openings 19, for example, by selective epitaxy. A memory cavity 49' is present in unfilled volumes of the memory opening 49. FIGS. 14A-14K illustrate structural changes in a memory opening 49, which is one of the memory openings 49 in the second exemplary structure. The same structural change occurs simultaneously in each of the other memory openings 49 and in each of the support openings 19 in the second exemplary structure.

Figure 14B:
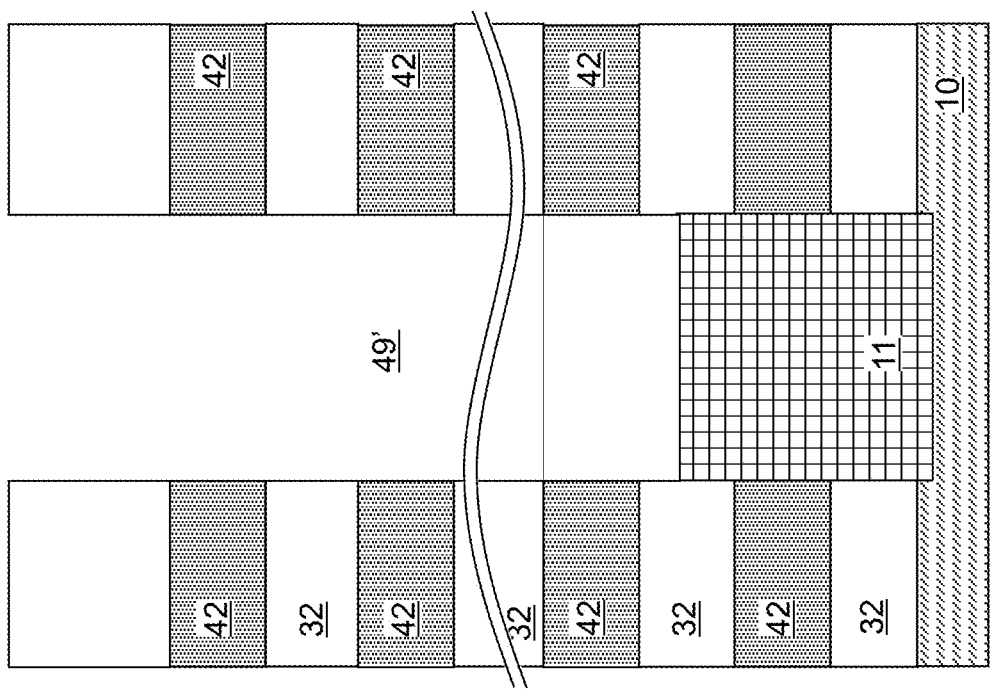

Referring to FIG. 14B, the sacrificial material layers 42 are laterally recessed selective to the insulating layers 32 by an isotropic etch process to form annular recess regions 349. The isotropic etch process can laterally recess sidewalls of the sacrificial material layers 42 relative to sidewalls of the insulating layers 32 around each memory opening 49. In one embodiment, the isotropic etch process may include a wet etch process. For example, if the insulating layers 32 include a silicon oxide material and if the sacrificial material layers 42 include silicon nitride, a wet etch process employing hot phosphoric acid can be employed to selectively etch the material of the sacrificial material layers 42 selective to the material of the insulating layers 32. In case the sacrificial material layers 42 includes a semiconductor material such as amorphous silicon or polysilicon, a wet etch process using hot trimethyl-2 hydroxyethyl ammonium hydroxide ("hot TMY") or tetramethyl ammonium hydroxide (TMAH) may be used to laterally recess the sacrificial material layers 42. In this case, the pedestal channel portion 11 may be collaterally vertically recessed. The annular recess regions 349 are formed around the memory opening 49 at levels of the sacrificial material layers 42 that are located above the horizontal plane including the top surface of the pedestal channel portion 11. The recessed sidewalls of the sacrificial material layers 42 can be cylindrical. The lateral recess distance of the first isotropic etch process can be in a range from 10 nm to 100 nm, such as from 20 nm to 50 nm, although lesser and greater lateral recess distances can also be employed.

Referring to FIG. 14C, an oxidation process can be performed to convert surface portions of the sacrificial material layers 42 that are physically exposed to the memory cavity 49' into silicon oxide blocking dielectric portions 152. The surface portions of the sacrificial material layers 42 around the annular recess regions 349 are converted into silicon oxide blocking dielectric portions 152. Each of the silicon oxide blocking dielectric portions 152 can have a tubular shape, and contacts a bottom surface of a respective overlying insulating layer 32 and contacts a top surface of a respective underlying insulating layer 32. The silicon oxide blocking dielectric portions 152 can be formed at each level of the sacrificial material layers 42 that are located above the horizontal plane including the top surface of the pedestal channel portion 11 as provided at the processing steps of FIG. 14B. The lateral thickness of each silicon oxide blocking dielectric portion 152, as measured between an inner sidewall and an outer sidewall, can be in a range from 3 nm to 20 nm, such as from 5 nm to 15 nm, although lesser and greater thicknesses can also be employed.

In case the sacrificial material layers 42 include silicon nitride, the silicon oxide blocking dielectric portions 152 can include residual nitrogen atoms at outer surface portions such that the atomic concentration of nitrogen atoms decreases with a lateral distance inward (i.e., toward the memory cavity 49') from the outer sidewall within each silicon oxide blocking dielectric portion 152. In case the sacrificial material layers include amorphous silicon or polysilicon, the silicon oxide blocking dielectric portions 152 can consist essentially of silicon oxide and optional dopant atoms (such as boron, phosphorus, and/or arsenic). A sacrificial silicon oxide plate 13 can be formed by collateral oxidation of a surface portion of the pedestal channel portion 11.

Referring to FIG. 14D, a set of material layers (541L, 542L, 543L) can be sequentially conformally deposited in the memory cavity 49' by a set of conformal deposition processes. The set of material layers (541L, 542L, 543L) can include an optional silicon nitride material layer 541L that is conformally deposited directly on the silicon oxide blocking dielectric portions 152, a silicon carbide nitride (i.e., silicon carbonitride) material layer 542L that is deposited directly on the silicon nitride material layer 541L, if present, or directly on the silicon oxide blocking dielectric portions 152 in case the silicon nitride material layer 541L is omitted, and a silicon nitride fill material layer 543L that is deposited on the silicon carbide nitride material layer 542L. The set of material layers (541L, 542L, 543L) is deposited in the annular recess regions 349 and at peripheral portions of the memory opening 49 as conformal material layers.

The silicon nitride material layer 541L can consist essentially of a stoichiometric or non-stoichiometric silicon nitride. The thickness of the silicon nitride material layer 541L can be in a range from 1 nm to 6 nm, such as from 2 nm to 4 nm, although lesser and greater thicknesses can also be employed. The silicon nitride material layer 541L can be deposited by a conformal deposition process such as low pressure chemical vapor deposition (LPCVD). The silicon carbide nitride material layer 542L includes a silicon carbide nitride material which contains any suitable non-zero atomic concentration of silicon, carbon and nitrogen, such as at least 5 atomic percent of silicon, carbon and nitrogen. In one embodiment, the atomic percentage of nitrogen atoms is between 5% and 20%, such as between 10% and 15%, the atomic percentage of silicon atoms is between 25% and 45%, such as between 30% and 40%, and the atomic percentage of carbon atoms is between 30% and 70%, such as between 50% and 60%. In one embodiment, the silicon carbide nitride material layer 542L may contain only silicon, carbon and nitrogen atoms and unavoidable impurities. In another embodiment, additional atoms other than silicon, carbon and nitrogen may be added at a concentration of 10 atomic percent or less. The silicon carbide nitride material layer 542L can be deposited by a conformal deposition process such as a low pressure chemical vapor deposition process employing a silicon precursor, a carbon precursor, and a nitrogen precursor, or by an atomic layer deposition process in which a silicon nitride deposition process and a carbonization process are repeated performed to provide a silicon carbide nitride material. The thickness of the silicon carbide nitride material layer 542L can be in a range from 1 nm to 10 nm, such as from 2 nm to 4 nm, although lesser and greater thicknesses can also be employed. An unfilled annular volume can be present within each of the annular recess regions 349 after deposition of the silicon carbide nitride material layer 542L.

The silicon nitride fill material layer 543L can consist essentially of a stoichiometric or non-stoichiometric silicon nitride. The thickness of the silicon nitride fill material layer 543L can be selected such that the unfilled annular volumes of the annular recess regions 349 after formation of the silicon carbide nitride material layer 542L are filled within the silicon nitride fill material layer 543L. The lateral thickness of the silicon nitride fill material layer 543L at levels of the insulating layers 32 can be in a range from 6 nm to 40 nm, such as from 10 nm to 25 nm, although lesser and greater thicknesses can also be employed. The silicon nitride fill material layer 543L can be deposited by a conformal deposition process such as low pressure chemical vapor deposition (LPCVD).

Referring to FIG. 14E, portions of the set of material layers (541L, 542L, 543L) located outside the volumes of the annular recess regions can be etched back by an etch back process. The etch back process may employ an isotropic etch process, an anisotropic etch process, or a combination thereof. In one embodiment, an anisotropic etch process such as a reactive ion etch process can be performed to etch portions of the set of material layers (541L, 542L, 543L) that are not masked by a respective overlying portion of the insulating layers 32. In this case, inner sidewalls of remaining portions of the set of material layers (541L, 542L, 543L) can be vertically coincident with sidewalls of the insulating layers 32. In another embodiment, an isotropic etch process that indiscriminately etches the materials of the set of material layers (541L, 542L, 543L) can be performed to remove portions of the set of material layers (541L, 542L, 543L) located outside the volumes of the annular recess regions 349. Generally, the set of material layers (541L, 542L, 543L) can be partly etched back such that portions of the set of material layers (541L, 542L, 543L) located on sidewalls of the insulating layers 32 are removed, and the sidewalls of the insulating layers 32 are physically exposed around each memory cavity 49'. The sacrificial silicon oxide plate 13 can be collaterally etched during the etch back process that partially etches the set of material layers (541L, 542L, 543L). For example, if an anisotropic etch process is employed to remove unmasked portions of the set of material layers (541L, 542L, 543L), the anisotropic etch process can etch the sacrificial silicon oxide plate 13 selective to the pedestal channel portion 11.

Remaining discrete material portions located in the annular recess regions 349 comprise discrete charge storage elements 154. Each discrete charge storage element 154 is a composite charge storage structure including multiple materials. Each of the discrete charge storage elements 154 comprises a silicon nitride portion 543, a silicon carbide nitride liner 542, and an optional silicon nitride liner 541. Each silicon nitride portion 543 is a remaining portion of the silicon nitride fill material layer 543L. Each silicon carbide nitride liner 542 is a remaining portion of the silicon carbide nitride material layer 542L. Each silicon nitride liner 541 is a remaining portion of the silicon nitride material layer 541L.

Each silicon carbide nitride liner 542 can be disposed between a respective silicon nitride portion 543 and a respective sacrificial material layer 42 located at a same level as the silicon nitride portion 543. Each silicon carbide nitride liner 542 can have a uniform composition throughout. Within each discrete charge storage element 154, the silicon carbide nitride liner 542 contacts a top surface of the silicon nitride portion 543, an outer sidewall of the silicon nitride portion 543, and a bottom surface of the silicon nitride portion 543. Within each discrete charge storage element 154, the silicon nitride liner 541 can contact the silicon carbide nitride liner 542. The silicon nitride liner 541 of each of the discrete charge storage elements 154 contacts a respective overlying one of the insulating layers 32, and contacts a respective underlying one of the insulating layers 32. In one embodiment, the silicon nitride liner 541 of each of the discrete charge storage elements 154 contacts an annular horizontal bottom surface of the respective overlying one of the insulating layers 32, contacts an annular horizontal top surface of the respective underlying one of the insulating layers 32, and contacts a cylindrical sidewall of a respective silicon oxide blocking dielectric portion 152. Each of the discrete charge storage elements 154 can have a respective tubular shape, and can be formed directly on a respective one of the silicon oxide blocking dielectric portions 152. In one embodiment, physically exposed cylindrical sidewalls of the discrete charge storage elements 154 and cylindrical sidewalls of the insulating layers 32 can be vertically coincident with each other, i.e., can be located within a cylindrical plane that vertically extends from the topmost surface of the pedestal channel portion to the top surface of the topmost insulating layer 32T.

Referring to FIG. 14F, a tunneling dielectric layer 56 can be deposited over the inner sidewalls of the discrete charge storage elements 154 and the physically exposed surfaces of the insulating layers 32. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

An optional first semiconductor channel layer 601 can be formed on the tunneling dielectric layer 56. The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is present in the volume of each memory opening 49.

Referring to FIG. 14G, the optional first semiconductor channel layer 601 and the tunneling dielectric layer 56 are sequentially anisotropically etched employing at least one anisotropic etch process. The portions of the first semiconductor channel layer 601 and the tunneling dielectric layer 56 located above the top surface of the topmost insulating layer 32T can be removed by the at least one anisotropic etch process. Further, the horizontal portions of the first semiconductor channel layer 601 and the tunneling dielectric layer 56 can be removed to form openings in remaining portions thereof. Each of the first semiconductor channel layer 601 and the tunneling dielectric layer 56 can be etched by a respective anisotropic etch process employing a respective etch chemistry, which may, or may not, be the same for the various material layers. Each remaining portion of the first semiconductor channel layer 601 can have a tubular configuration.

A surface of the pedestal channel portion 11 (or a surface of the semiconductor material layer 10 in case the pedestal channel portions 11 are not employed) can be physically exposed underneath the opening through the first semiconductor channel layer 601 and the tunneling dielectric layer 56. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. The combination of the vertical stack of silicon oxide blocking dielectric portions 152, the vertical stack of discrete charge storage elements 154, and the tunneling dielectric layer 56 constitutes a memory film 150.

Referring to FIG. 14H, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 14I, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 14J, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the topmost insulating layer 32T and a second horizontal plane including the bottom surface of the topmost insulating layer 32T. Each remaining portion of the dielectric core layer 62L constitutes a dielectric core 62.

Figure 14K:
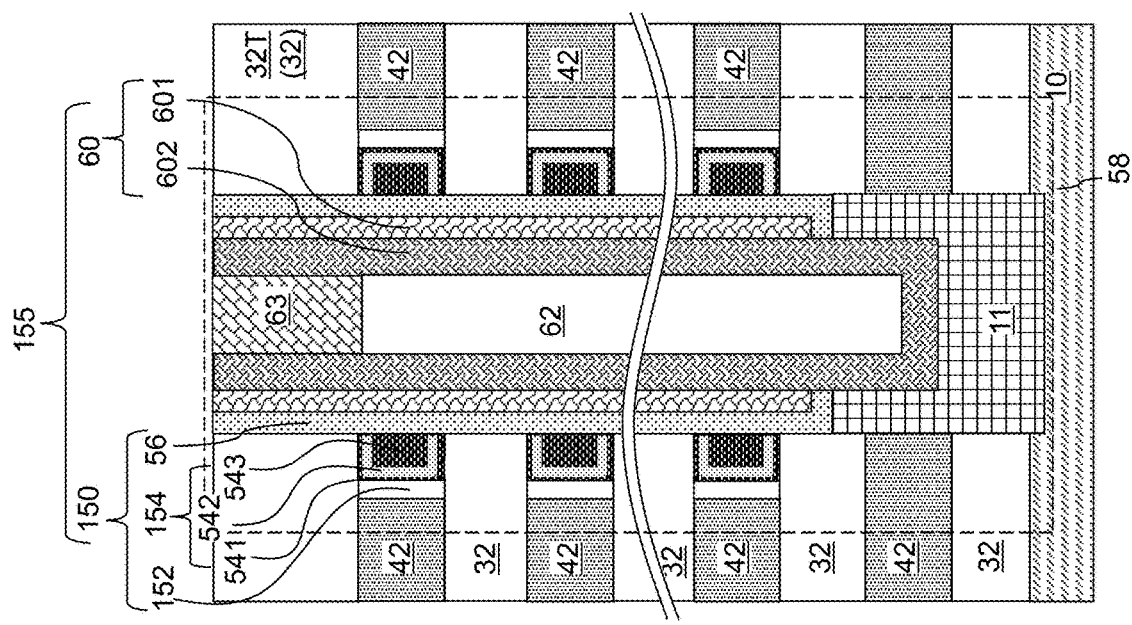

Referring to FIG. 14K, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Excess portions of the deposited semiconductor material can be removed from above the top surface of the topmost insulating layer 32T, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the topmost insulating layer 32T can be concurrently removed by a planarization process. Each remaining portion of the second semiconductor channel layer 602 can be located entirely within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a vertical stack of discrete charge storage elements 154, and laterally surrounds a portion of the vertical semiconductor channel 60. The vertical stack of discrete charge storage elements 154 can store a respective data bit with a macroscopic retention time. As used herein, a macroscopic retention time refers to a retention time suitable for operation of a memory device as a permanent memory device such as a retention time in excess of 24 hours.

Each combination of a memory film 150 and a vertical semiconductor channel 60 within a memory opening 49 constitutes a memory stack structure 155. The memory stack structure 155 is a combination of a vertical semiconductor channel 60, a tunneling dielectric layer 56, a vertical stack of discrete charge storage elements 154, and a vertical stack of silicon oxide blocking dielectric portions 152. Each combination of a pedestal channel portion 11 (if present), a memory stack structure 155, a dielectric core 62, and a drain region 63 within a memory opening 49 is herein referred to as a memory opening fill structure 58. Each combination of a pedestal channel portion 11 (if present), a memory film 150, a vertical semiconductor channel 60, a dielectric core 62, and a drain region 63 within each support opening 19 fills the respective support openings 19, and constitutes a support pillar structure.

Figure 15:
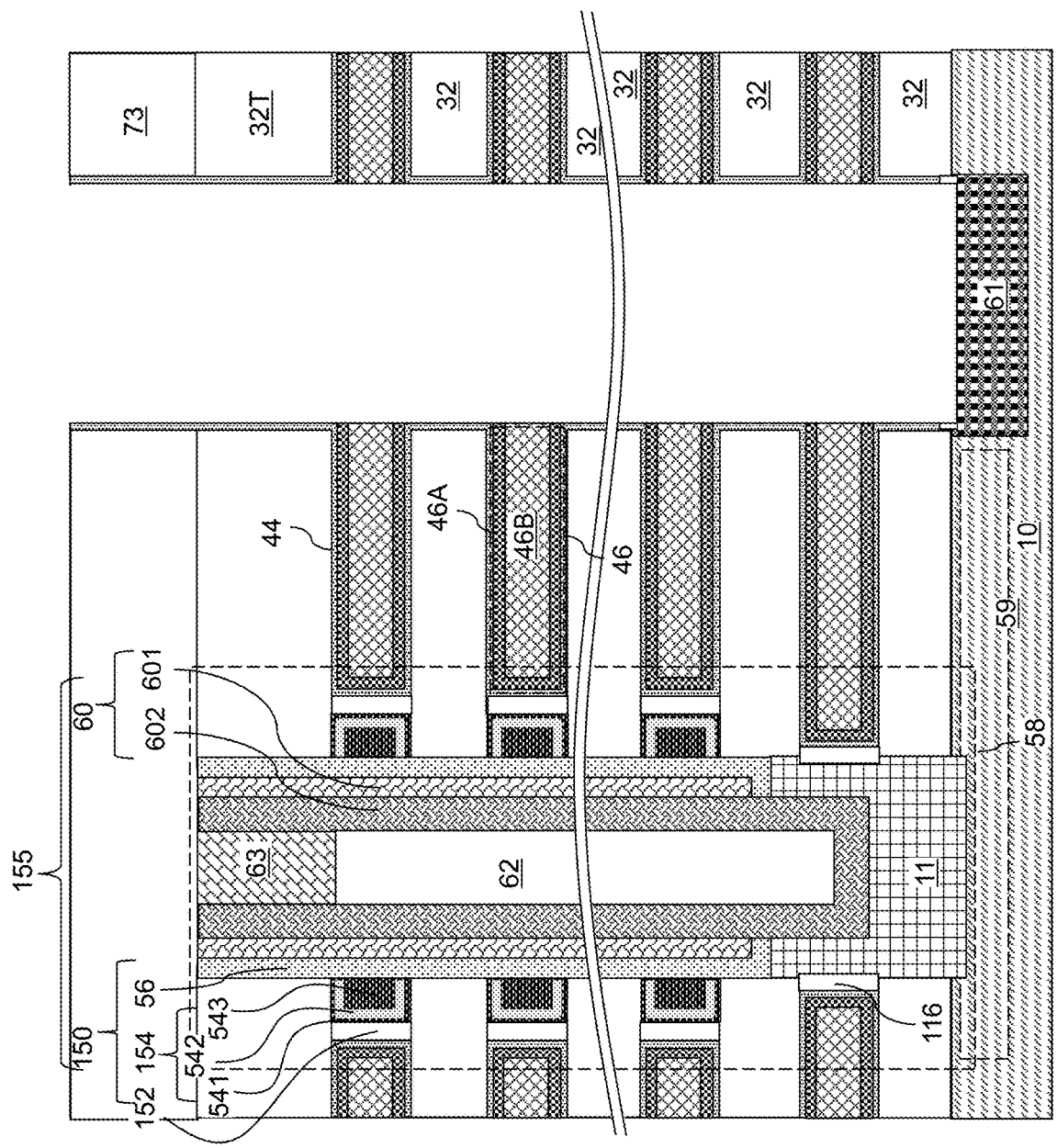
FIG. 15 is a vertical cross-sectional view of a region of the second exemplary structure after replacement of the sacrificial material layers with electrically conductive layers and removal of a deposited conductive material from within the backside trenches according to the second embodiment of the present disclosure.

Referring to FIG. 15, the processing steps of FIGS. 7A-7C, 8, 9A and 9B, 10A-10C, and 11A-11C can be subsequently performed to form a contact-level dielectric layer 73, backside trenches 79, source regions 61, backside recesses 43, optional backside blocking dielectric layers 44, and electrically conductive layers 46.

Figure 16:
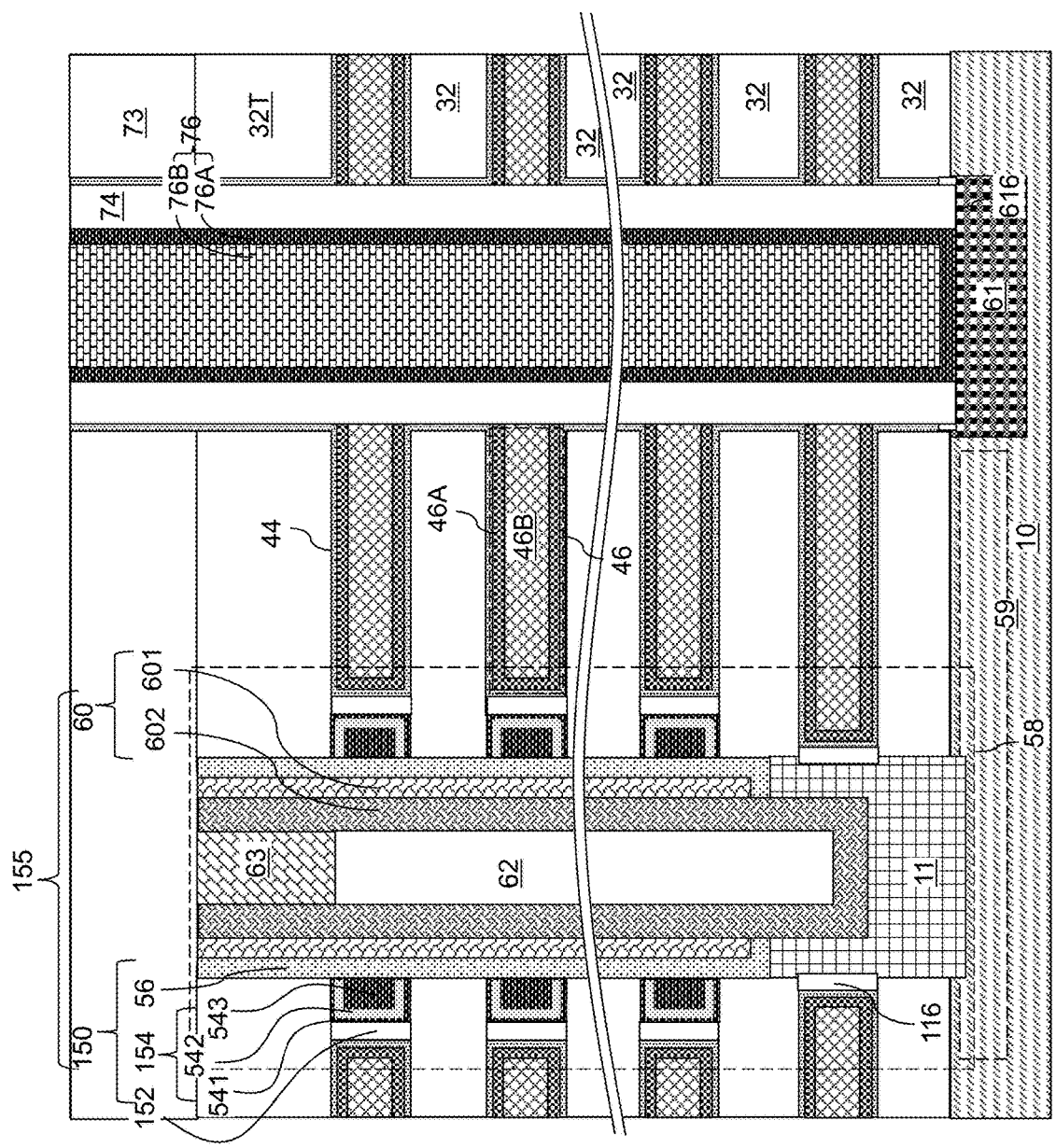
FIG. 16 is a vertical cross-sectional view of a region of the second exemplary structure after formation of backside contact via structures according to the second embodiment of the present disclosure.

Referring to FIG. 16, the processing steps of FIGS. 11, 12A, and 12B can be performed to form an insulating spacer 74 and a backside contact via structure 76 in each backside trench 79, and to form various contact via structures (88, 86, 8P) in the same manner as in the first embodiment.

Figure 17:
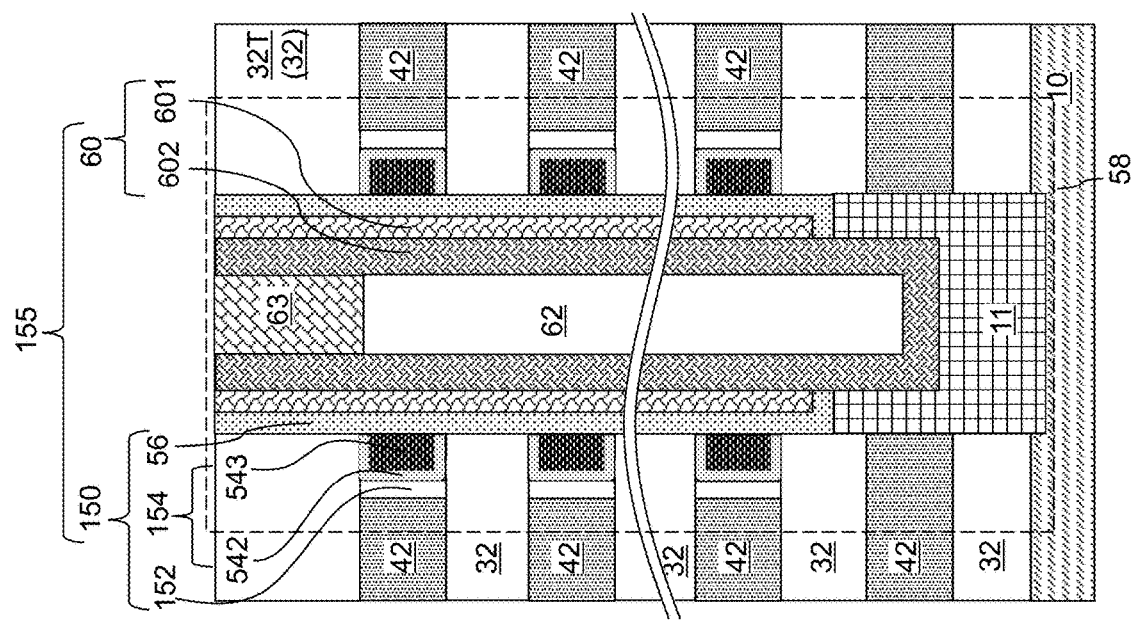
FIG. 17 is a vertical cross-sectional view of a memory opening within an alternative configuration of the second exemplary structure after formation of a memory opening fill structure according to a second embodiment of the present disclosure.

Referring to FIG. 17, a memory opening fill structure 58 within an alternative configuration of the second exemplary structure according to a second embodiment of the present disclosure is illustrated, which can be derived from the memory opening fill structure 58 of FIG. 14K by omitting formation of the optional silicon nitride material layer 541L at the processing steps of FIG. 14D. Instead, the silicon carbide nitride material layer 542L is deposited directly on the silicon oxide blocking dielectric portions 152.

Each discrete charge storage element 154 does not include a silicon nitride liner 541 in the alternative configuration of the second exemplary structure. In this case, the silicon carbide nitride liner 542 of each of the discrete charge storage elements 154 contacts a respective overlying one of the insulating layers 32, and contacts a respective underlying one of the insulating layers 32. In one embodiment, the silicon carbide nitride liner 542 of each of the discrete charge storage elements 154 contacts an annular horizontal bottom surface of the respective overlying one of the insulating layers 32, contacts an annular horizontal top surface of the respective underlying one of the insulating layers 32, and contacts a cylindrical sidewall of a respective silicon oxide blocking dielectric portion 152.

Figure 18:
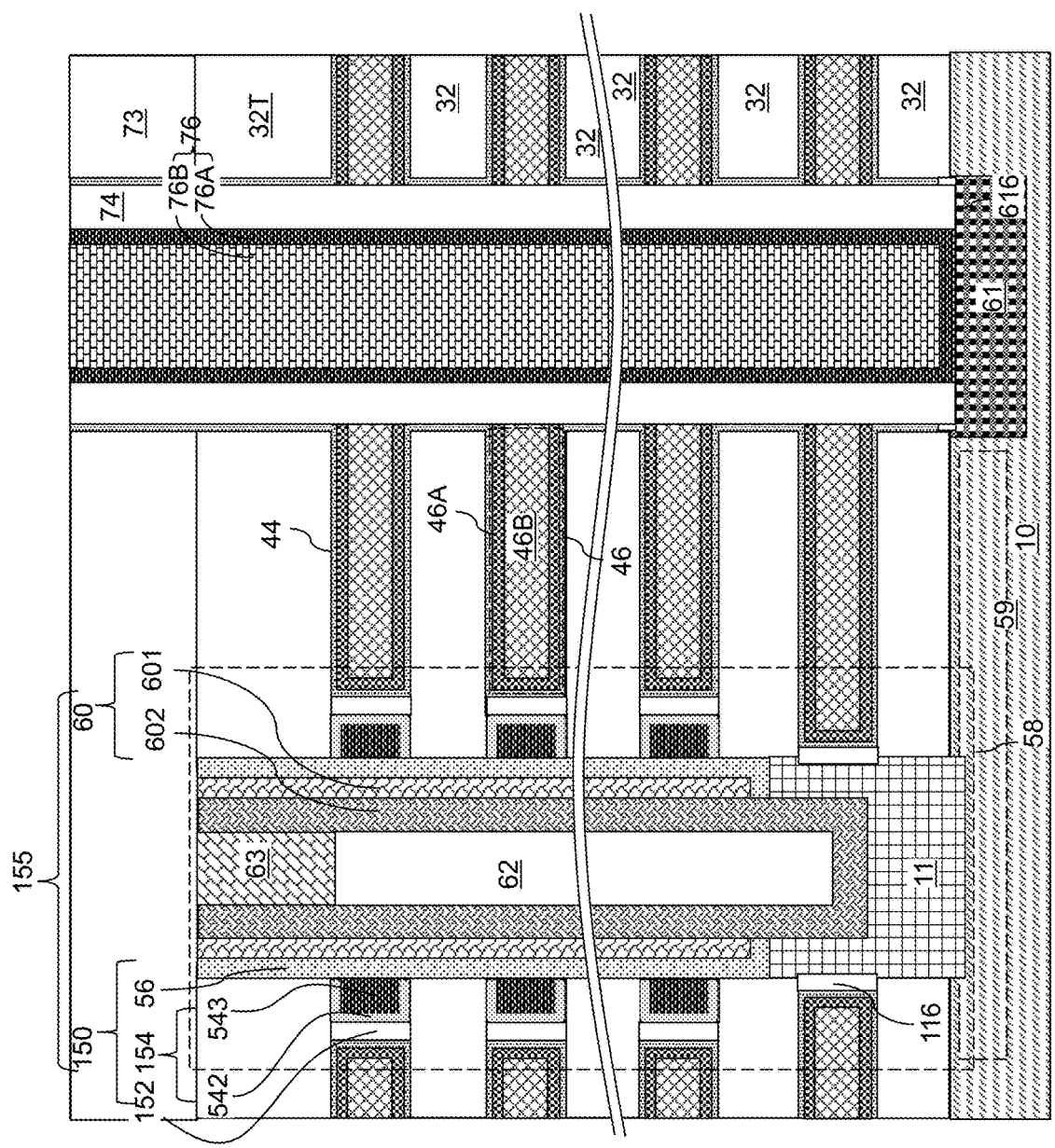
FIG. 18 is a vertical cross-sectional view of a region of the alternative configuration of the second exemplary structure after formation of backside contact via structures according to the second embodiment of the present disclosure.

Referring to FIG. 18, the processing steps of FIGS. 7A-7C, 8, 9A and 9B, 10A-10C, and 11A-11C can be subsequently performed to form a contact-level dielectric layer 73, backside trenches 79, source regions 61, backside recesses 43, optional backside blocking dielectric layers 44, and electrically conductive layers 46. Further, the processing steps of FIGS. 11, 12A, and 12B can be performed to form an insulating spacer 74 and a backside contact via structure 76 in each backside trench 79, and to form various contact via structures (88, 86, 8P) in the same manner as in the first embodiment.

Figure 19:
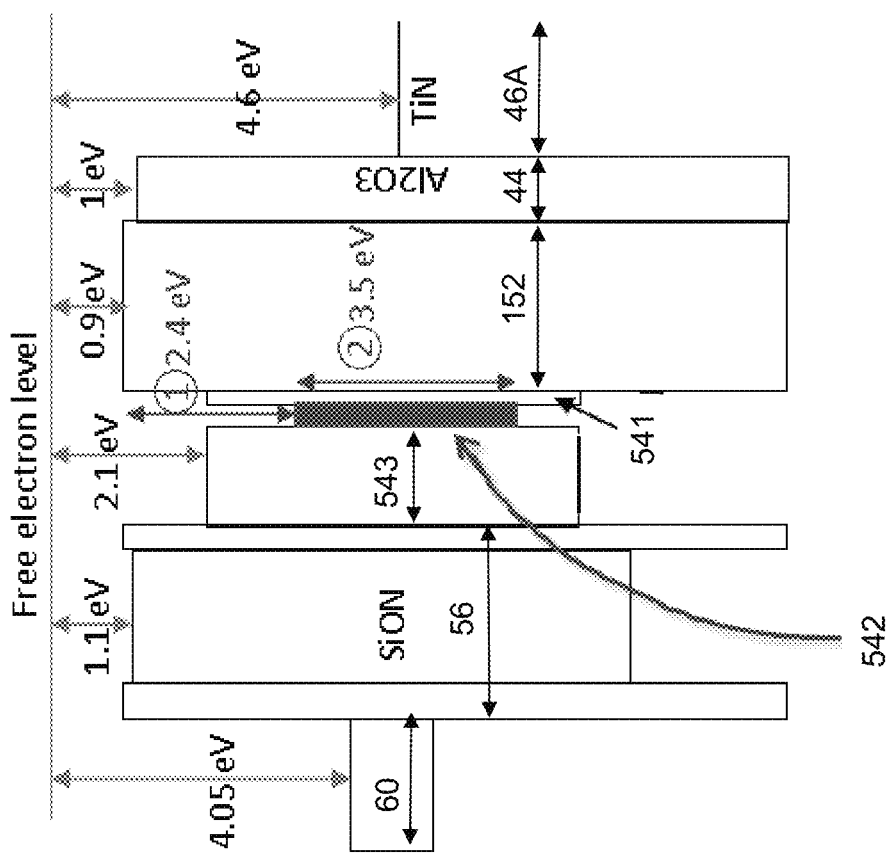
FIG. 19 is a band diagram of a region between an electrically conductive layer and a vertical semiconductor channel within the second exemplary structure of FIG. 16 when the external bias voltage to the electrically conductive layer is zero.

Referring to FIG. 19, a band diagram of a region between an electrically conductive layer 46 and a vertical semiconductor channel 60 within the second exemplary structure of FIG. 16 is illustrated when the external bias voltage to the electrically conductive layer 46 relative to the vertical semiconductor channel 60 is zero. In the illustrative example, the tunneling dielectric layer 56 can include an ONO stack. The ONO stack can include a first silicon oxide layer, a silicon oxynitride layer, and a second silicon oxide layer. The discrete charge storage element 154 includes a stack of a silicon nitride portion 543, a silicon carbide nitride liner 542, and a silicon nitride liner 541. The silicon carbide nitride liner 542 has a band gap energy (i.e., the difference between the conduction band and the valence band) in a range from 3.3 eV to 3.8 eV depending on the material composition. The silicon carbide nitride liner 542 forms a deeper well than a well formed by a charge storage element consisting of silicon nitride. This may reduce electron leakage into the electrically conductive layers 46. Better programming efficiency and a high program slope can be achieved by a discrete charge storage element 154 including a stack of a silicon nitride portion 543, a silicon carbide nitride liner 542, and a silicon nitride liner 541, or by a discrete charge storage element 154 including a stack of a silicon nitride portion 543 and a silicon carbide nitride liner 542, than a comparative exemplary charge storage element consisting of a single silicon nitride material portion.

Without wishing to be bound by a particular theory, it is believed that a significant portion of the electrons is stored in the part of the discrete charge storage element 154 closer to the blocking dielectric than to the tunneling dielectric. Therefore, in one embodiment, the silicon carbide nitride liner 542 with the deeper conduction band well is provided closer to the blocking dielectric (e.g., the silicon oxide blocking dielectric portions 152) than to the tunneling dielectric 60 to provide the electron storage well in the location where the significant portion of the electrons is stored. Therefore, if the silicon nitride liner 541 is present in the discrete charge storage element 154, then the silicon nitride liner 541 is thinner than the silicon nitride portion 543 to form the carbide nitride liner 542 closer to the blocking dielectric than to the tunneling dielectric. For example, the silicon nitride liner 541 is at least 50% thinner, such as 75% to 300% thinner than the silicon nitride portion 543.

Referring to FIGS. 14A to 19 and according to the second embodiment of the present disclosure, a memory device comprises an alternating stack of insulating layers 32 and electrically conductive layers 46 located over a substrate (9, 10), and a memory stack structure 58 extending through the alternating stack (32, 46). The memory stack structure 58 comprises a vertical stack of discrete charge storage elements 154 that are vertically spaced apart from each other and located at levels of the electrically conductive layers 46, a tunneling dielectric layer 56 located on inner sidewalls of the discrete charge storage elements 154, and a vertical semiconductor channel 60 contacting an inner sidewall of the tunneling dielectric layer 56. Each of the discrete charge storage elements 154 comprises: a silicon nitride portion 543 including an inner sidewall that contacts an outer sidewall of the tunneling dielectric layer 56; and a silicon carbide nitride liner 542 in contact with the silicon nitride portion 543.

In one embodiment, the silicon carbide nitride liner 542 contacts a top surface of the silicon nitride portion 543, an outer sidewall of the silicon nitride portion 543, and a bottom surface of the silicon nitride portion 543 within each of the discrete charge storage elements 154. In one embodiment, each silicon carbide nitride liner 542 has a uniform composition throughout.

In one embodiment, edge portions of the silicon carbide nitride liner 542 are in contact with the outer sidewall of the tunneling dielectric layer 56.

In one embodiment, the atomic percentage of nitrogen atoms is between 5% and 20%, such as between 10% and 15%, the atomic percentage of silicon atoms is between 25% and 45%, such as between 30% and 40%, and the atomic percentage of carbon atoms is between 30% and 70%, such as between 50% and 60%, in the silicon carbide nitride liner 542.

In one embodiment, the memory device comprises silicon oxide blocking dielectric portions 152 located at each level of the discrete charge storage elements 154. Each of the discrete charge storage elements 154 is laterally spaced from a respective one of the electrically conductive layers 46 by a respective one of the silicon oxide blocking dielectric portions 152. In one embodiment, each of the silicon oxide blocking dielectric portions 152 has a respective tubular shape, contacts a bottom surface of a respective overlying one of the insulating layers 32, and contacts a top surface of a respective underlying one of the insulating layers 32. In one embodiment, each of the silicon oxide blocking dielectric portions 152 contacts the silicon carbide nitride liner 142.

In one embodiment, the silicon carbide nitride liner 542 of each of the discrete charge storage elements 154 contacts a respective overlying one of the insulating layers 32, and contacts a respective underlying one of the insulating layers 32. In one embodiment, the silicon carbide nitride liner 542 of each of the discrete charge storage elements 154 contacts an annular horizontal bottom surface of the respective overlying one of the insulating layers 32, contacts an annular horizontal top surface of the respective underlying one of the insulating layers 32, and contacts a cylindrical sidewall of a respective silicon oxide blocking dielectric portion 32.

In one embodiment, each of the discrete charge storage elements 154 further comprises a silicon nitride liner 541 contacting the silicon carbide nitride liner 542 and the outer sidewall of the tunneling dielectric layer 56. In one embodiment, the silicon nitride liner 541 of each of the discrete charge storage elements 154 contacts a respective overlying one of the insulating layers 32, and contacts a respective underlying one of the insulating layers 32. In one embodiment, the silicon nitride liner 541 of each of the discrete charge storage elements 154 is thinner than the silicon nitride portion 543.

In one embodiment, all surfaces of the silicon nitride portion 543 are in contact with the outer sidewall of the tunneling dielectric layer 56 or with a respective surface of the silicon carbide nitride liner 542 in each of the discrete charge storage elements 154. In one embodiment, each of the discrete charge storage elements 154 has a respective tubular shape; and the outer sidewall of the tunneling dielectric layer 56 has a straight vertical profile that extends through, and contacts, each of the discrete charge storage elements 154 in the memory opening fill structure 58.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device comprising:
an alternating stack of insulating layers and electrically conductive layers located over a substrate; and
a memory stack structure extending through the alternating stack, wherein the memory stack structure comprises a composite charge storage structure, a tunneling dielectric layer located on an inner sidewall of the composite charge storage structure, and a vertical semiconductor channel contacting an inner sidewall of the tunneling dielectric layer, wherein the composite charge storage structure comprises:
a vertical stack of discrete tubular charge storage material portions including a first charge trapping material located at levels of the electrically conductive layers and vertically spaced apart from each other;
a continuous charge storage layer including a second charge trapping material and extending through a plurality of the electrically conductive layers, wherein the first charge trapping material has a higher charge trap density than the second charge trapping material;
a blocking dielectric layer that continuously extends through the plurality of electrically conductive layers and laterally surrounding the composite charge storage structure; and
a metal oxide backside blocking dielectric layer is located between the blocking dielectric layer which comprises silicon oxide and each of the electrically conductive layers.

2. The memory device of claim 1, wherein each of the tubular charge storage material portions contacts a portion of an outer sidewall of the continuous charge storage layer.

3. The memory device of claim 2, wherein an entirety of an inner sidewall of the continuous charge storage layer contacts an outer sidewall of the tunneling dielectric layer.

4. The memory device of claim 1, wherein:
the blocking dielectric layer comprises laterally-protruding portions that protrude outward from the composite charge storage structure; and
interfaces between the blocking dielectric layer and the insulating layers include annular horizontal surface portions.

5. The memory device of claim 1, wherein an inner sidewall of the blocking dielectric layer comprises:
insulating-layer-level sidewall segments located at levels of the insulating layers; and
annular recessed sidewall segments that are located at levels of the plurality of electrically conductive layers and laterally recessed outward relative to insulating-layer-level sidewall segments.

6. The memory device of claim 5, wherein the tubular charge storage material portions are vertically spaced apart from each other by the insulating-layer-level sidewall segments of the blocking dielectric layer.

7. The memory device of claim 5, wherein each of the tubular charge storage material portions contacts a respective one of the annular recessed sidewall segments and has a respective inner sidewall that is vertically coincident with an overlying one of the insulating-layer-level sidewall segments of the blocking dielectric layer.

8. The memory device of claim 1, wherein:
the first charge storage material comprises aluminum nitride or a silicon-rich silicon nitride material; and
the second charge storage material comprises silicon nitride.

9. The memory device of claim 1, wherein:
the alternating stack comprises a terrace region in which each electrically conductive layer other than a topmost electrically conductive layer within the alternating stack laterally extends farther than any overlying electrically conductive layer within the alternating stack;
the terrace region includes stepped surfaces of the alternating stack; and
support pillar structures extend through the stepped surfaces and through a retro-stepped dielectric material portion that overlies the stepped surfaces.

10. A method of forming a memory device, comprising:
forming an alternating stack of insulating layers and spacer material layers over a substrate, wherein the spacer material layers are formed as, or are subsequently replaced with, electrically conductive layers;
forming a memory opening through the alternating stack; and
forming a memory stack structure by sequentially forming a composite charge storage structure, a tunneling dielectric layer, and a vertical semiconductor channel in the memory opening,
wherein the composite charge storage structure is formed by:
forming a vertical stack of tubular charge storage material portions including a first charge trapping material and at levels of the electrically conductive layers as discrete material portions that are vertically spaced apart by the insulating layers; and
forming a charge storage layer including a second charge trapping material and extending through a plurality of electrically conductive layers of the electrically conductive layers;
wherein:
the charge storage layer comprises silicon nitride; and
the tubular charge storage material portions comprise aluminum nitride or a silicon-rich silicon nitride material.

11. The method of claim 10, wherein the first charge trapping material has a higher charge trap density than the second charge trapping material.

12. The method of claim 10, further comprising forming annular recess regions by laterally recessing sidewalls of the spacer material layers relative to sidewalls of the insulating layers around the memory opening, wherein the tubular charge storage material portions are formed within volumes of the annular recess regions.

13. The method of claim 12, further comprising forming a blocking dielectric layer on the sidewalls of the insulating layers and the spacer material layers by conformally depositing a dielectric material, wherein the tubular charge storage material portions are formed on the blocking dielectric layer.

14. The method of claim 13, further comprising:
depositing the first charge trapping material in unfilled volumes of the annular recess regions after formation of the blocking dielectric layer; and
removing portions of the first charge trapping material inside a cylindrical volume defined by sidewall segments of the blocking dielectric layer located at levels of the insulating layers by performing an anisotropic etch process that etches the first charge trapping material, wherein remaining portions of the first charge trapping material comprise the tubular charge storage material portions.

15. A method of forming a memory device, comprising:
forming an alternating stack of insulating layers and spacer material layers over a substrate, wherein the spacer material layers are formed as, or are subsequently replaced with, electrically conductive layers;

forming a memory opening through the alternating stack; and forming a memory stack structure by sequentially forming a composite charge storage structure, a tunneling dielectric layer, and a vertical semiconductor channel in the memory opening, wherein the composite charge storage structure is formed by:

forming a vertical stack of tubular charge storage material portions including a first charge trapping material and at levels of the electrically conductive layers as discrete material portions that are vertically spaced apart by the insulating layers; and forming a charge storage layer including a second charge trapping material and extending through a plurality of electrically conductive layers of the electrically conductive layers; and further comprising:

forming annular recess regions by laterally recessing sidewalls of the spacer material layers relative to sidewalls of the insulating layers around the memory opening, wherein the tubular charge storage material portions are formed within volumes of the annular recess regions;

forming a blocking dielectric layer on the sidewalls of the insulating layers and the spacer material layers by conformally depositing a dielectric material, wherein the tubular charge storage material portions are formed on the blocking dielectric layer; and isotropically etching a material of the insulating layers after formation of the annular recess regions and prior to formation of the blocking dielectric layer, wherein annular top surfaces of the spacer material layers and annular bottom surfaces of the spacer material layers are physically exposed to the annular recess regions.

16. A method of forming a memory device, comprising:

forming an alternating stack of insulating layers and spacer material layers over a substrate, wherein the spacer material layers are formed as, or are subsequently replaced with, electrically conductive layers;

forming a memory opening through the alternating stack; and forming a memory stack structure by sequentially forming a composite charge storage structure, a tunneling dielectric layer, and a vertical semiconductor channel in the memory opening, wherein the composite charge storage structure is formed by:

forming a vertical stack of tubular charge storage material portions including a first charge trapping material and at levels of the electrically conductive layers as discrete material portions that are vertically spaced apart by the insulating layers; and forming a charge storage layer including a second charge trapping material and extending through a plurality of electrically conductive layers of the electrically conductive layers; and wherein the spacer material layers are formed as sacrificial material layers, and the method comprises:

forming backside recesses by removing the spacer material layers selective to the insulating layers after formation of the memory stack structure; and forming a combination of a backside blocking dielectric layer and a respective one of the electrically conductive layers within each of the backside recesses.

17. A method of forming a memory device, comprising:

forming an alternating stack of insulating layers and spacer material layers over a substrate, wherein the spacer material layers are formed as, or are subsequently replaced with, electrically conductive layers;

forming a memory opening through the alternating stack; and forming a memory stack structure by sequentially forming a composite charge storage structure, a tunneling dielectric layer, and a vertical semiconductor channel in the memory opening, wherein the composite charge storage structure is formed by:

forming a vertical stack of tubular charge storage material portions including a first charge trapping material and at levels of the electrically conductive layers as discrete material portions that are vertically spaced apart by the insulating layers; and forming a charge storage layer including a second charge trapping material and extending through a plurality of electrically conductive layers of the electrically conductive layers; and further comprising:

forming a terrace region by patterning the alternating stack, wherein each spacer material layer other than a topmost spacer material layer within the alternating stack laterally extends farther than any overlying spacer material layers within the alternating stack;

forming a retro-stepped dielectric material portion over the terrace region by depositing a dielectric material over the terrace region; and forming support pillar structures through the retro-stepped dielectric material portion and portions of the alternating stack that underlie the retro-stepped dielectric material portion.

* * * * *